(12) United States Patent
Uenda et al.

(10) Patent No.: US 8,841,757 B2
(45) Date of Patent: Sep. 23, 2014

(54) FILM FOR THE BACKSIDE OF FLIP-CHIP TYPE SEMICONDUCTOR, DICING TAPE-INTEGRATED FILM FOR THE BACKSIDE OF SEMICONDUCTOR, METHOD OF MANUFACTURING FILM FOR THE BACKSIDE OF FLIP-CHIP TYPE SEMICONDUCTOR, AND SEMICONDUCTOR DEVICE

(75) Inventors: Daisuke Uenda, Ibaraki (JP); Takeshi Matsumura, Ibaraki (JP); Koichi Inoue, Ibaraki (JP); Miki Morita, Ibaraki (JP)

(73) Assignee: Nitto Denko Corporation, Osaka (JP)

(*) Notice: Subject to any disclaimer, the term of this patent is extended or adjusted under 35 U.S.C. 154(b) by 329 days.

(21) Appl. No.: 13/298,614

(22) Filed: Nov. 17, 2011

(65) Prior Publication Data

US 2012/0126380 A1 May 24, 2012

(30) Foreign Application Priority Data

Nov. 18, 2010 (JP) ................................. 2010-258060

(51) Int. Cl.
*H01L 21/00* (2006.01)
*H01L 23/552* (2006.01)
*H01L 21/683* (2006.01)
*H01L 21/56* (2006.01)
*H01L 23/544* (2006.01)

(52) U.S. Cl.
CPC ..... H01L 23/552 (2013.01); *H01L 2224/81193* (2013.01); *H01L 2221/68327* (2013.01); *H01L 2221/68386* (2013.01); *H01L 21/563* (2013.01); *H01L 2224/13147* (2013.01); *H01L 2224/13139* (2013.01); *H01L 2924/01079* (2013.01); *H01L 2224/16245* (2013.01); *H01L 2224/13111* (2013.01); *H01L 2924/01037* (2013.01); *H01L 2924/01019* (2013.01); *H01L 2224/831* (2013.01); *H01L 2224/13116* (2013.01); *H01L 2221/68377* (2013.01); *H01L 2224/83862* (2013.01); H01L 21/6836 (2013.01); *H01L 2224/16225* (2013.01); *H01L 23/544* (2013.01); *H01L 2224/13118* (2013.01); *H01L 2224/81815* (2013.01); *H01L 2224/13144* (2013.01); *H01L 2224/13113* (2013.01); *H01L 2924/01055* (2013.01); *H01L 2224/73204* (2013.01)
USPC .......................................... 257/659; 438/118

(58) Field of Classification Search
USPC .......................................... 257/659; 438/118
See application file for complete search history.

(56) References Cited

U.S. PATENT DOCUMENTS 8,420,509 B2 * 4/2013 Takamoto et al. ............ 438/464
2002/0074144 A1 6/2002 Watanabe et al.
(Continued)

FOREIGN PATENT DOCUMENTS

CN 1318849 10/2001
CN 1433263 7/2003
(Continued)

OTHER PUBLICATIONS

First Office Action dated Jun. 7, 2013 in corresponding Chinese patent application No. 201110367402.1.
(Continued)

*Primary Examiner* — Evan Pert
(74) *Attorney, Agent, or Firm* — Knobbe, Martens, Olson & Bear LLP

(57) ABSTRACT

An electromagnetic wave shielding layer can be provided on the backside of a semiconductor element that is flip-chip connected to an adherend, and a semiconductor device having the electromagnetic wave shielding layer can be manufactured without deteriorating productivity. The present invention provides a film for the backside of a flip-chip type semiconductor to be formed on the backside of a semiconductor element that is flip-chip connected to an adherend, having an adhesive layer and an electromagnetic wave shielding layer.

7 Claims, 10 Drawing Sheets

(56) References Cited

U.S. PATENT DOCUMENTS

| | | |
|---|---|---|
| 2003/0136572 A1 | 7/2003 | Arakawa et al. |
| 2004/0104326 A1 | 6/2004 | Demel et al. |
| 2005/0121213 A1 | 6/2005 | Arakawa et al. |
| 2008/0237820 A1 | 10/2008 | Kim et al. |
| 2009/0053518 A1 | 2/2009 | Saiki et al. |
| 2010/0164077 A1 | 7/2010 | Bando et al. |
| 2010/0193969 A1 | 8/2010 | Takamoto |
| 2011/0156279 A1* | 6/2011 | Takamoto et al. ............ 257/778 |
| 2012/0126380 A1* | 5/2012 | Uenda et al. ................ 257/659 |
| 2012/0126381 A1* | 5/2012 | Uenda et al. ................ 257/659 |

FOREIGN PATENT DOCUMENTS

| | | |
|---|---|---|
| CN | 101183677 | 5/2008 |
| CN | 101794722 | 8/2010 |
| JP | 55-111151 A | 8/1980 |
| JP | 2002-261233 A | 9/2002 |
| JP | 2004-063551 A | 2/2004 |
| JP | 2004-072108 A | 3/2004 |
| JP | 2004-142430 A | 5/2004 |
| JP | 2004-214288 A | 7/2004 |
| JP | 2004-221169 A | 8/2004 |
| JP | 2007-158026 A | 6/2007 |
| JP | 2007-250970 A | 9/2007 |
| JP | 2007-261035 A | 10/2007 |
| JP | 2007-287937 | 11/2007 |
| JP | 2008-006386 A | 1/2008 |
| JP | 2008-108828 * | 5/2008 ............ H01L 21/301 |
| JP | 4133637 B2 | 6/2008 |
| JP | 2008-166451 A | 7/2008 |
| JP | 2010-153760 A | 7/2010 |

OTHER PUBLICATIONS

Notification of the Second Office Action dated Jan. 15, 2014 in corresponding Chinese patent application No. 201110367402.1.

Third Office Action dated May 14, 2014 in corresponding Chinese patent application No. 201110367402.1.

* cited by examiner (a)

(b)

(c)

(d)

FILM FOR THE BACKSIDE OF FLIP-CHIP TYPE SEMICONDUCTOR, DICING TAPE-INTEGRATED FILM FOR THE BACKSIDE OF SEMICONDUCTOR, METHOD OF MANUFACTURING FILM FOR THE BACKSIDE OF FLIP-CHIP TYPE SEMICONDUCTOR, AND SEMICONDUCTOR DEVICE

This application claims priority to Japanese Patent Application No. 2010-258060, filed Nov 10,2010. the above-referenced application is hereby expressly incorporated by reference in its entirety.

BACKGROUND OF THE INVENTION

1. Field of the Invention

The present invention relates to a film for the backside of a flip-chip type semiconductor and a dicing tape-integrated film for the backside of a semiconductor. The film for the backside of a flip-chip type semiconductor is used to protect the backside of a semiconductor element such as a semiconductor chip, and to improve the strength. The present invention also relates to a method of manufacturing a film for the backside of a flip-chip type semiconductor, and a flip-chip mounted semiconductor device.

2. Description of the Related Art

In recent years, there have been increasing demands for thickness reduction and size reduction of semiconductor devices and packages thereof. Because of that, a flip-chip type semiconductor device has been broadly used in which a semiconductor element such as a semiconductor chip is mounted on a substrate by flip-chip bonding (flip-chip connection) as a semiconductor device and a package thereof. In flip-chip connection, a semiconductor chip is fixed to a substrate in a condition that the circuit surface of the semiconductor chip is opposite to the electrode forming surface of the substrate. There are cases where damages of the semiconductor chip are prevented by protecting the backside of the semiconductor chip with a protective film in such a semiconductor device (refer to Japanese Patent Application Laid-Open Nos. 2008-166451, 2008-006386, 2007-261035, 2007-250970, 2007-158026, 2004-221169, 2004-214288, 2004-142430, 2004-072108, and 2004-063551, for example).

Furthermore, in recent years, the wiring width of power supply lines that are arranged across the whole area of the circuit surface of a semiconductor element and the space between signal lines have become narrower to correspond to demands for microfabrication and high function of semiconductor devices. Because of this, an increase of impedance and an interference between signals in signal lines of different nodes occur, which have become an impediment to sufficient performance in operating speed, the degree of operating voltage margin, and anti-electrostatic breakdown strength of the semiconductor chip.

Conventionally, a package structure in which semiconductor chips are laminated has been proposed to solve the above-described problems (refer to Japanese Patent Application Laid-Open Nos. 55-111151 and 2002-261233, for example).

On the other hand, the frequency range of an electromagnetic wave (noise) that is emitted from a semiconductor chip has become varied due to the diversification of electronic components in recent years. When the semiconductor elements are laminated as in the above-described package structure, there is a possibility that the electromagnetic wave emitted from one semiconductor chip has a bad influence on other semiconductor chips, the substrate, adjacent devices, and the package.

An electromagnetic wave shielding sheet for adhering a semiconductor element having a pressure-sensitive adhesive layer on both outermost surfaces of a laminated body consisting of an electrical insulation layer and a ferrite layer is disclosed in Japanese Patent No. 4133637. It is also described in Japanese Patent No. 4133637 that leakage of an electrical signal is attenuated by the magnetic loss characteristic of the ferrite layer of the electromagnetic wave shielding sheet for adhering a semiconductor element.

Further, a semiconductor device in which a first magnetic shielding material is arranged between a die pad and the backside of a semiconductor chip and a second magnetic shielding material is arranged on the main surface of the semiconductor chip is disclosed in Japanese Patent Application Laid-Open No. 2010-153760. It is also described in Japanese Patent Application Laid-Open No. 2010-153760 that resistance of the semiconductor device to an external magnetic field is improved.

SUMMARY OF THE INVENTION

However, an electromagnetic wave shielding sheet for adhering a semiconductor element of Japanese Patent No. 4133637 is provided between a semiconductor element and a substrate, and is not provided on the surface opposite to the substrate of the semiconductor element. Because of that, the electromagnetic wave that is emitted from the surface opposite to the substrate of the semiconductor element cannot be decreased.

The semiconductor device of Japanese Patent Application Laid-Open No. 2010-153760 is manufactured by the steps of pasting a first film material having tackiness to the backside of a semiconductor wafer, pasting a first magnetic shielding material onto the first film material, and then pasting a second film material having tackiness to the backside of the first magnetic shielding material. However, in such a manufacturing process, the step of pasting the first magnetic shielding material and the step of pasting the second film material are added to a conventional manufacturing process of a semiconductor device, and the number of manufacturing steps is increased. Therefore, there has been a problem of lack of productivity.

The present inventors investigated a film for the backside of a flip-chip type semiconductor, a dicing tape-integrated film for the backside of a semiconductor, and a method of manufacturing a film for the backside of a flip-chip type semiconductor to solve the above-described conventional problems. As a result, they found that, by adopting the following configuration, an electromagnetic wave shielding layer can be provided on the backside of a semiconductor element that is flip-chip connected to an adherend and that a semiconductor device having the electromagnetic wave shielding layer can be manufactured without deteriorating productivity, and completed the present invention.

That is, the film for the backside of a flip-chip type semiconductor according to the present invention is a film for the backside of a flip-chip type semiconductor to be formed on the backside of a semiconductor element that is flip-chip connected to an adherend, having an adhesive layer and an electromagnetic wave shielding layer.

The film for the backside of a flip-chip type semiconductor is pasted to the backside of the semiconductor element that is flip-chip connected to the adherend. Therefore, according to the above-described configuration, the electromagnetic wave shielding layer can be provided on the backside (surface opposite to the adherend) of the semiconductor element that is provided in the flip-chip type semiconductor device. As a result, the influence of an electromagnetic wave that is emitted from the backside (surface opposite to the adherend) of the semiconductor element on other semiconductor elements, the substrate, adjacent devices, and the package can be decreased. The film for the backside of a flip-chip type semiconductor of the present invention has an adhesive layer and an electromagnetic wave shielding layer, and can be pasted to the backside of the semiconductor element. That is, the electromagnetic wave shielding layer can be provided on the backside of the semiconductor element in one step without multiple steps such that the adhesive layer is formed on the backside of the semiconductor element and the electromagnetic wave shielding layer is formed. As a result, an increase of the manufacturing steps can be suppressed as much as possible.

The dicing tape-integrated film for the backside of a semiconductor according to the present invention is a dicing tape-integrated film for the backside of a semiconductor in which the film for the backside of a flip-chip type semiconductor is laminated on a dicing tape, wherein the dicing film has a structure in which a pressure-sensitive adhesive layer is laminated on a base and the film for the backside of a flip-chip type semiconductor is laminated on the pressure-sensitive adhesive layer of the dicing tape.

Because the dicing tape-integrated film for the backside of a semiconductor having the above-described configuration is formed integrally with a dicing tape and a film for the backside of a flip-chip type semiconductor, it can be used in a dicing step in which a semiconductor element is produced by dicing a semiconductor wafer and a pickup step that follows the dicing step. Because the film for the backside of a semiconductor can also be pasted when the dicing tape is pasted to the backside of the semiconductor wafer before the dicing step, a step of pasting only a film for the backside of a semiconductor (a step of pasting a film for the backside of a semiconductor) is not necessary. As a result, the number of steps can be reduced. In addition, because the film for the backside of a semiconductor protects the semiconductor wafer and the backside of the semiconductor element that is formed by dicing, damages of the semiconductor element can be decreased or prevented in the dicing step and the steps following the dicing step such as a pickup step. As a result, the manufacturing yield of the flip-chip type semiconductor device can be improved.

The method of manufacturing a film for the backside of a flip-chip type semiconductor according to the present invention is a method of manufacturing the above-described film for the backside of a flip-chip type semiconductor, including the steps of: forming an adhesive layer and forming an electromagnetic wave shielding layer on the adhesive layer.

Because the film for the backside of a flip-chip type semiconductor manufactured according to the above-described configuration has an electromagnetic wave shielding layer, it is not necessary to add a step of forming the electromagnetic wave shielding layer when manufacturing a semiconductor device. That is, the electromagnetic wave shielding layer can be provided on the backside of the semiconductor element in one step without requiring multiple steps such as a step of forming the adhesive layer on the backside of the semiconductor element and a step of forming the electromagnetic wave shielding layer. As a result, an increase of the manufacturing steps can be suppressed as much as possible.

The semiconductor device according to the present invention is a semiconductor device having a film for the backside of a flip-chip type semiconductor to solve the above-described problems.

Figure 1:
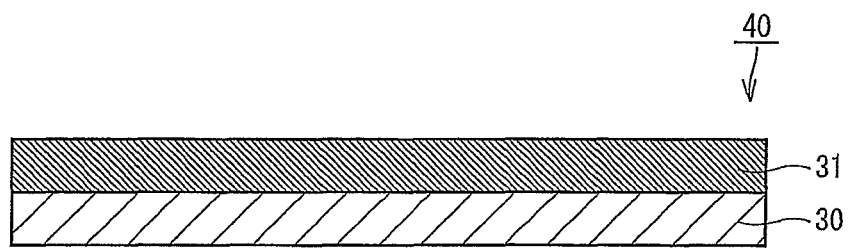
FIG. 1 is a sectional schematic drawing showing a film for the backside of a flip-chip type semiconductor according to one embodiment of the present invention.

| DESCRIPTION OF THE REFERENCE NUMERALS | |
|---|---|
| 1 | Dicing tape-integrated film for the backside of semiconductor |
| 2 | Dicing tape |
| 21 | Base |
| 22 | Pressure-sensitive adhesive layer |
| 23 | Portion corresponding to semiconductor wafer pasting portion |
| 40, 41 | Film for the backside of semiconductor (film for the backside of flip-chip type semiconductor) |
| 4 | Semiconductor wafer |
| 5 | Semiconductor chip |
| 51 | Bump formed on the circuit surface side of the semiconductor chip 5 |
| 6 | Adherend |
| 61 | Conductive material for bonding that is adhered to connection pad of the adherend 6 |

DESCRIPTION OF THE PREFERRED EMBODIMENTS (Film for the Backside of Flip-chip Type Semiconductor)

Figure 2:
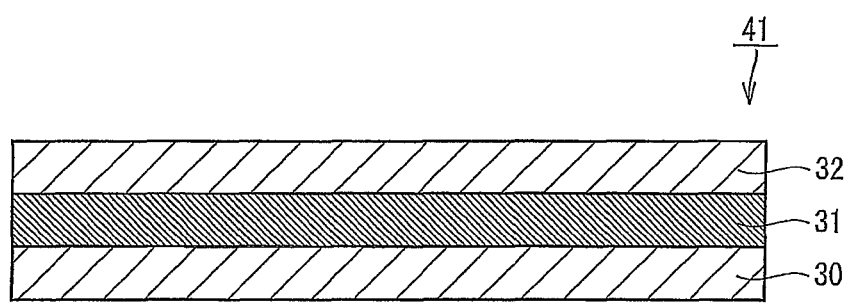
FIG. 2 is a sectional schematic drawing showing the film for the backside of a flip-chip type semiconductor according to another embodiment of the present invention.

The film for the backside of a flip-chip type semiconductor (may be referred to as a "film for the backside of a semiconductor" in the following) according to one embodiment of the present invention is explained below. FIG. 1 is a sectional schematic drawing showing a film for the backside of a flip-chip type semiconductor according to one embodiment of the present invention and FIG. 2 is a sectional schematic drawing showing the film for the backside of a flip-chip type semiconductor according to another embodiment. As shown in FIG. 1, a film for the backside of semiconductor 40 has a configuration in which an electromagnetic wave shielding layer 31 is laminated on an adhesive layer 30. The film for the backside of semiconductor according to the present invention may have a configuration in which an adhesive layer 32 is further laminated on the magnetic wave shielding layer 31 as in a film for the backside of semiconductor 41 shown in FIG. 2. The film for the backside of semiconductor according to the present invention is not limited to the film for the backside of semiconductors 40 and 41 as long as it has an adhesive layer and an electromagnetic wave shielding layer, and it may have other layers besides the adhesive layer and the electromagnetic wave shielding layer, for example.

Examples of the electromagnetic wave shielding layer 31 include a conductive layer, a dielectric layer, and a magnetic layer. An example of the conductive layer is a layer having an inorganic conductive material or an organic conductive material. Examples of the inorganic conductive material include at least one metal element selected from the group consisting of Li, Na, K, Rb, Cs, Ca, Sr, Ba, Ra, Be, Mg, Zn, Cd, Hg, Al, Ga, In, Y, La, Ce, Pr, Nd, Sm, Eu, Ti, Zr, Sn, Hf, Pb, Th, Fe, Co, N, V, Nb, Ta, Cr, Mo, W, U, Mn, Re, Cu, Ag, Au, Ru, Rh, Pd, Os, Ir, and Pt, oxides of these metal elements, and alloys of these metal elements. Examples of the organic conductive material include polyacetylene, polyparaphenylene, polyaniline, polythiophene, polyparaphenylenevinylene, and polypyrrole. The organic conductive materials can be used alone or two types or more can be used together. Further, the inorganic conductive materials and the organic conductive materials can be used together. The conductive layer may be a layer consisting only of a conductive material such as a metal foil or a vapor deposited film, or it may be a layer in which the inorganic conductive material or the organic conductive material is compounded in a resin. Among these, conductive layers having an electric conductivity of $10 \times 10^1$ to $10 \times 10^7$ S/m are preferable, conductive layers having an electric conductivity of $5 \times 10^2$ to $5 \times 10^7$ S/m are more preferable, and conductive layers having an electric conductivity of $10 \times 10^2$ to $1 \times 10^7$ S/m are further preferable. The conductive layer can attenuate an electromagnetic wave due to reflection loss. The metal foil consists of the above-described inorganic conductive materials, and is manufactured by thinly expanding the inorganic conductive materials (about 0.1 to 100 μm, for example).

The material used in the dielectric layer is not especially limited. Examples thereof include synthetic resins such as polyethylene, polyester, polystyrene, polyimide, polycarbonate, polyamide, polysulfone, polyethersulfone, polyvinyl chloride, and epoxy, and various synthetic rubber materials such as polyisoprene rubber, polystyrene butadiene rubber, polybutadiene rubber, chloroprene rubber, acrylonitrile butadiene rubber (NBR), butyl rubber, acrylic rubber, ethylene propylene rubber, and silicon rubber. Other examples include materials in which inorganic materials such as carbon, titanium oxide, alumina, barium titanate, and Rochelle salt are added into these resins. Among these, dielectric layers having a relative permittivity of 1.0 to 4000 are preferable, dielectric layers having a relative permittivity of 1.0 to 1000 are more preferable, and dielectric layers having a relative permittivity of 1.0 to 100 are further preferable. The dielectric layer can attenuate an electromagnetic wave due to dielectric loss.

The magnetic particles used in the magnetic layer are not especially limited. Examples thereof include hematite ($Fe_2O_3$; magnetite ($Fe_3O_4$); various ferrites represented by the general formulae $MFe_2O_4$ and $MO \cdot nFe_2O_3$ (wherein M is a divalent metal particle and examples thereof include Mn, Co, Ni, Cu, Zn, Ba, and Mg; n is a positive number: and M may be of the same type or a different type when repeated); silicon steel powder; various metal powders and alloy powders thereof such as permalloy (Fe—Ni alloy), Co-based amorphous alloy, Sendust (Fe—Al—Si alloy), alperm, supermalloy, permendar, and perminvar; and magnetic powder. Finemet (registered tradename) manufactured by Hitachi Metals, Ltd. can also be used. These can be used alone or two types or more can be used together. The magnetic layer can be a layer in which the above-described magnetic particles are compounded in a resin. The magnetic layer can attenuate an electromagnetic wave due to a magnetic loss. The electromagnetic wave shielding effect can be exhibited further by using a layer in which the conductive materials (the above-described organic conductive materials and inorganic conductive materials) and the above-described magnetic particles are compounded as the electromagnetic wave shielding layer 31.

The thickness of the electromagnetic wave shielding layer 31 is not especially limited. It can be selected from a range of 0.001 to 10000 μm, preferably 0.005 to 900 μm, and more preferably 0.01 to 800 μm. However, the thickness of the electromagnetic wave shielding layer 31 differs according to the frequency of the electromagnetic wave to be shielded when the electromagnetic wave shielding characteristic is given by the dielectric layer or the magnetic layer. In general, the thickness is preferably ¼ or more of the wavelength ($\lambda$) of the electromagnetic wave to be shielded.

The attenuation of the electromagnetic wave that penetrates the film for the backside of semiconductors 40 and 41 is preferably 3 dB or more in at least a portion of the frequency range of 50 MHz to 20 GHz. The frequency range is more preferably in a range of 80 MHz to 19 GHz, and further preferably in a range of 100 MHz to 18 GHz. The attenuation is more preferably 4 dB or more, and further preferably 5 dB or more. When the attenuation of the electromagnetic wave that penetrates the d film for the backside of semiconductors 40 and 41 is 3 dB or more in at least a portion of the relatively high frequency range of 50 MHz to 20 GHz, the electromagnetic wave can be more efficiently shielded. Therefore, the influence of an electromagnetic wave emitted from one semiconductor element on other semiconductor elements, the substrate, adjacent devices, and the package can be decreased.

The 180 degree peeling strength between the adhesive layer 30 and the electromagnetic wave shielding layer 31 and the 180 degree peeling strength between the adhesive layer 32 and the electromagnetic wave shielding layer 31 are preferably 0.5 N/10 mm or more, more preferably 0.8 N/10 mm, and further preferably 1.0 N/10 mm or more. By making the 180 degree peeling strength 0.5 N/10 mm or more, interlayer peeling becomes difficult to occur and the yield can be improved.

The 180 degree peeling strength can be measured as follows. First, the adhesive layer is lined with a pressure-sensitive adhesive tape (BT-315 manufactured by Nitto Denko Corporation) and cut into a piece of 10×100 mm. Next, the electromagnetic wave shielding layer is lined with a pressure-sensitive adhesive tape (BT-315 manufactured by Nitto Denko Corporation) and cut into a piece of 10×100 mm. Then, the cut adhesive layer and the cut electromagnetic wave shielding layer are pasted together using a laminator (MRK-600 manufactured by MCK Co., Ltd.) under conditions of 50° C., 0.5 MPa, and 10 mm/sec. After that, the resultant is left for 20 minutes under an atmosphere of normal temperature (25° C.), and a test piece is obtained. The 180 degree peeling force between the adhesive layer and the electromagnetic wave shielding layer is measured using a tensile tester (AGS-J manufactured by Shimadzu Corporation).

The adhesive layers 30 and 32 are formed of at least a thermosetting resin, and preferably formed of at least a thermosetting resin and a thermoplastic resin.

Examples of the thermoplastic resin include a natural rubber, a butyl rubber, an isoprene rubber, a chloroprene rubber, an ethylene-vinyl acetate copolymer, an ethylene-acrylate copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET (polyethylene terephthalate) and PBT (polybutylene terephthalate), a polyamideimide resin, and a fluororesin. The thermoplastic resins can be used alone or two types or more can be used together. Of these thermoplastic resins, acrylic resin is particularly preferable since the resin contains ionic impurities in only a small amount and has a high heat resistance so as to make it possible to ensure the reliability of the semiconductor element.

The acrylic resin is not especially limited, and examples thereof include a polymer having one type or two types or more of acrylates or methacrylates having a linear or branched alkyl group having 30 or less carbon atoms (preferably 4 to 18 carbon atoms, further preferably 6 to 10 carbon atoms, and especially preferably 8 or 9 carbon atoms) as a component. That is, the acrylic resin of the present invention has a broad meaning and also includes a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (a lauryl group), a tridecyl group, a tetradecyl group, a stearyl group, and an octadecyl group.

Other monomers that can form the above-described acrylic resin (monomers other than an alkylester of acrylic acid or methacrylic acid having an alkyl group having 30 or less carbon atoms) are not especially limited. Examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl (meth)acrylate, 4-hydroxybutyl(meth)acrylate, 6-hydroxyhexyl (meth)acrylate, 8-hydroxyoctyl(meth)acrylate, 10-hydroxydecyl(meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

Among these, a carboxyl group-containing monomer is preferable from the viewpoint that the tensile storage modulus Ea of the die bond film can be set at a preferred value. (Meth)acrylate refers to an acrylate and/or a methacrylate, and every "(meth)" in the present invention has the same meaning.

Examples of the thermosetting resin include an epoxy resin, a phenol resin, an amino resin, an unsaturated polyester resin, a polyurethane resin, a silicone resin, and a thermosetting polyimide resin. The thermosetting resins can be used alone or two types or more can be used together. An epoxy resin having a small amount of ionic impurities that erode the semiconductor element is especially suitable as the thermosetting resin. Further, a phenol resin can be suitably used as a curing agent for the epoxy resin.

The epoxy resin is not especially limited, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a bisphenyl type epoxy resin, a naphthalene type epoxy resin, a fluorene type epoxy resin, a phenol novolak type epoxy resin, an ortho-cresol novolak type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin.

Among the above-described epoxy resins, a novolak type epoxy resin, a biphenyl type epoxy resin, a trishydroxyphenylmethane type epoxy resin, and a tetraphenylolethane type epoxy resin are especially preferable. These epoxy resins are highly reactive with a phenol resin as a curing agent and are excellent in heat resistance.

The phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, a resol type phenol resin, and polyoxystyrenes such as polyparaoxystyrene. The phenol resins can be used alone or two types or more can be used together. Among these phenol resins, a phenol novolak resin and a phenol aralkyl resin are especially preferable because connection reliability of the semiconductor device can be improved.

The phenol resin is suitably compounded in the epoxy resin so that a hydroxyl group in the phenol resin to 1 equivalent of an epoxy group in the epoxy resin component becomes 0.5 to 2.0 equivalents. The ratio is more preferably 0.8 to 1.2 equivalents. When the compounding ratio goes out of this range, sufficient curing reaction does not proceed, and the characteristics of the epoxy resin cured substance easily deteriorate.

A thermal curing accelerating catalyst for an epoxy resin and a phenol resin may be used in the present invention. The thermal curing accelerating catalyst is not especially limited, and the catalyst can be appropriately selected from known thermal curing accelerating catalysts. The thermal curing accelerating catalysts can be used alone or two types or more can be used together. Examples of the thermal curing accelerating catalyst include an amine curing accelerator, a phosphorus curing accelerator, an imidazole curing accelerator, a boron curing accelerator and a phosphorus-boron curing accelerator.

The adhesive layers 30 and 32 are suitably formed of a resin composition containing an epoxy resin and a phenol resin and a resin composition containing an epoxy resin, a phenol resin, and an acrylic resin. Because these resins have few ionic impurities and high heat resistance, reliability of the semiconductor element can be ensured.

Further, a polyimide resin can be used alone besides combination use with other resins as a thermosetting polyimide resin or a thermoplastic polyimide resin as the adhesive composition that constitutes the adhesive layers 30 and 32. The polyimide resin is a heat resistant resin that can be generally obtained by a dehydration condensation (imidization) of polyamic acid that is a precursor thereof. The polyamic acid can be obtained by reacting a diamine component with an acid anhydride component in an appropriate organic solvent at a substantially equal molar ratio.

Examples of the diamine include aliphatic diamines and aromatic diamines. Examples of the aliphatic diamines include ethylenediamine, hexamethylenediamine, 1,8-diaminooctane, 1,10-diaminodecane, 1,12-diaminododecane, 4,9-dioxa-1,12-diaminododecane, and 1,3-bis(3-aminopropyl)-1,1,3,3-tetramethyldisiloxane($\alpha,\omega$-b isaminopropyltetramethyldisiloxane). The molecular weight of the aliphatic diamine is normally 50 to 1,000,000 and preferably 100 to 30,000.

Examples of the aromatic diamines include 4,4'-diaminodiphenylether, 3,4'-diaminodiphenylether, 3,3'-diaminodiphenylether, m-phenylenediamine, p-phenylenediamine, 4,4'-diaminodiphenylpropane, 3,3'-diaminodiphenylmethane, 4,4'-diaminodiphenylsulfide, 3,3'-diaminodiphenylsulfide, 4,4'-diaminodiphenylsulfone, 3,3'-diaminodiphenylsulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, and 4,4'-diaminobenzophenone.

Various acid anhydrides can be used. An example thereof is a tetracarboxylic dianhydride. Examples of the tetracarboxylic dianhydride include a 3,3',4,4'-biphenyltetracarboxylic dianhydride, a 2,2',3,3'-biphenyltetracarboxylic dianhydride, 3,3',4,4'-benzophenonetetracarboxylic dianhydride, a 2,2',3,3'-benzophenonetetracarboxylic dianhydride, a 4,4'-oxydiphthalic dianhydride, a 2,2-bis(2,3-dicarboxyphenyl)hexafluoropropane dianhydride, a 2,2-bis(3,4-dicarboxyphenyl)hexafluoropropane dianhydride (6FDA), a bis(2,3-dicarboxyphenyl)methane dianhydride, a bis(3,4-dicarboxyphenyl)methane dianhydride, a bis(2,3-dicarboxyphenyl)sulfone dianhydride, a bis(3,4-dicarboxyphenyl)sulfone dianhydride, a pyromellitic dianhydride, and an ethyleneglycol bistrimellitic dianhydride. These may be used alone or two types or more may be used together.

The solvent in which the diamine and the acid anhydride are reacted is not especially limited. Examples thereof include N,N-dimethylacetamide, N-methyl-2-pyrrolidone, N,N-dimethylformamide, and cyclopentanone. These can be used by appropriately mixing with a non-polar solvent such as toluene or xylene to adjust solubility of the raw material and the resin.

Examples of a method of imidizing polyamic acid include a heat imidization method, an azeotropic dehydration method, and a chemical imidization method. Among these, a heat imidization method is preferable, and the heating temperature is preferably 150° C. or more. In the heat imidization method, the treatment is preferably performed under an inert atmosphere such as a nitrogen atmosphere or a vacuum to prevent oxidation deterioration of the resin. With this treatment, volatile components remaining in the resin can be removed completely.

When reacting the diamine with the tetracarboxylic dianhydride, especially when a diamine having a butadiene-acrylonitrile copolymer skeleton is used, the reaction is preferably performed at a temperature of 100° C. or more. With this operation, gelation can be prevented.

It is important that the adhesive layer 30 has tackiness (adhesion) to the backside (the surface where a circuit is not formed) of a semiconductor wafer. The adhesive layer 30 can be formed of a resin composition containing an epoxy resin as a thermosetting resin, for example. A polyfunctional compound that reacts with a functional group of the end of the polymer molecular chain is preferably added as a crosslinking agent to crosslink the adhesive layer 30 to some extent in advance. With this operation, the adhesion characteristics under high temperature can be improved and the heat resistance can be improved.

The crosslinking agent is not especially limited, and a known crosslinking agent can be used. Specific examples thereof include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent. An isocyanate crosslinking agent and an epoxy crosslinking agent are preferable. The crosslinking agents can be used alone or two type or more can be used together.

Examples of the isocyanate crosslinking agent include lower aliphatic polyisocyanates such as 1,2-ethylene diisocyanate, 1,4-butylene isocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisiocyanate. A trimethylolpropane/tolylene diisocyanate trimer adduct (tradename: Coronate L manufactured by Nippon Polyurethane Industry Co., Ltd.) and a trimethylolpropane/hexamethylene diisocyanate trimer adduct (tradename: Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglyserol polyglycidylether, sorbitan polyglycidylether, trimethylolpropane polyglycidylether, diglycidyl adipate, diglycidyl o-phthalate, triglycidyl-tris(2-hydroxyethyl)isocyanurate, resorcin diglycidylether, bisphenol-s-diglycidyl ether, and an epoxy resin having two or more epoxy groups in the molecule.

The used amount of the crosslinking agent is not especially limited, and can be appropriately selected according to the level of crosslinking. Specifically, the used amount of the crosslinking agent is normally preferably 7 parts by weight or less (0.05 to 7 parts by weight, for example) to 100 parts by weight of a polymer component (especially, a polymer having a functional group at the end of the molecular chain) for example. When the used amount of the crosslinking agent is more than 7 parts by weight to 100 parts by weight of the polymer component, it is not preferable because the adhering strength decreases. From the viewpoint of improving cohesive strength, the used amount of the crosslinking agent is preferably 0.05 parts by weight or more to 100 parts by weight of the polymer component.

In the present invention, it is possible to perform a crosslinking treatment by irradiation with an electron beam, an ultraviolet ray, or the like in place of using the crosslinking agent or together with a crosslinking agent.

In the film 40 for the backside of a semiconductor, the adhesive layer 30 is preferably colored. In the film 41 for the backside of a semiconductor, at least one of the adhesive layers 30 and 32 is preferably colored. With this configuration, the films 40 and 41 for the backside of a semiconductor can exhibit an excellent marking property and an excellent appearance, and a semiconductor device can be obtained having an appearance with added value. Because the colored film for the backside of a semiconductor has an excellent marking property, various information such as character information and pattern information can be given to a semiconductor device or the surface where a circuit is not formed of the semiconductor device in which the semiconductor element is marked through the film for the backside of a semiconductor using various marking methods such as a printing method and a laser marking method. Especially, the information such as character information and pattern information that is given by marking can be recognized visually with excellent visibility by controlling the color. Because the film for the backside of a semiconductor is colored, the dicing tape and the film for the backside of a semiconductor can be easily distinguished, and workability can be improved. It is possible to color-code the semiconductor device by product, for example. When the film for the backside of a semiconductor is colored (when it is not colorless or transparent), the color is not especially limited. However, the color is preferably a dark color such as black, blue, or red, and black is especially preferable.

In this embodiment, the dark color means a dark color having $L^*$ that is defined in the $L^*a^*b^*$ color system of basically 60 or less (0 to 60), preferably 50 or less (0 to 50) and more preferably 40 or less (0 to 40).

The black color means a blackish color having $L^*$ that is defined in the $L^*a^*b^*$ color system of basically 35 or less (0 to 35), preferably 30 or less (0 to 30) and more preferably 25 or less (0 to 25). In the black color, each of $a^*$ and $b^*$ that is defined in the $L^*a^*b^*$ color system can be appropriately selected according to the value of $L^*$. For example, both of $a^*$ and $b^*$ are preferably −10 to 10, more preferably −5 to 5, and especially preferably −3 to 3 (above all, 0 or almost 0).

In this embodiment, $L^*$, $a^*$, and $b^*$ that are defined in the $L^*a^*b^*$ color system can be obtained by measurement using a colorimeter (tradename: CR-200 manufactured by Konica Minolta Holdings, Inc.). The $L^*a^*b^*$ color system is a color space that is endorsed by Commission Internationale de l'Eclairage (CIE) in 1976, andmeans a color space that is called a CIE1976 ($L^*a^*b^*$) color system. The $L^*a^*b^*$ color system is provided in JIS Z 8729 in the Japanese Industrial Standards.

When coloring the adhesive layers 30 and 32, a coloring material (coloring agent) can be used according to the objective color. Various dark color materials such as black color materials, blue color materials, and red color materials can be suitably used, and especially the black color materials are suitable. The color materials may be any of pigments, dyes, and the like. The color materials can be used alone or two types or more can be used together. Any dyes such as acid dyes, reactive dyes, direct dyes, dispersive dyes, and cationic dyes can be used. The pigments are also not especially limited in the form, and may be appropriately selected from known pigments.

When dyes are used as the color materials, the films 40 and 41 for the backside of a semiconductor (consequently a dicing tape-integrated film 1 for the backside of a semiconductor) having uniform or almost uniform coloring concentration can be easily manufactured because the dyes disperse uniformly or almost uniformly due to dissolution in the adhesive layers 30 and 32. Because of that, when the dyes are used as the color materials, the coloring concentration of the film for the backside of a semiconductor in the dicing tape-integrated film for the backside of a semiconductor can be made uniform or almost uniform, and the marking property and the appearance can be improved.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as non-magnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

Examples of such black color materials that are available on the market include Oil Black BY, Oil Black BS, Oil Black HBB, Oil Black 803, Oil Black 860, Oil Black 5970, Oil Black 5906, and Oil Black 5905 manufactured by Orient Chemical Industries Co., Ltd.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43, C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two types or more of various color materials such as cyan color materials, magenta color materials, and yellow color materials are used, the mixing ratio or the compounding ratio of these color materials is not especially limited, and can be appropriately selected according to the types of each color material and the intended color.

When coloring the adhesive layers 30 and 32, the colored state of the layers is not especially limited. For example, the adhesive layers 30 and 32 may be a single layered film in which the coloring agent is added. They may also be a laminated film in which at least a resin layer formed at least of a thermosetting resin and a coloring agent layer are laminated. When the adhesive layers 30 and 32 are in the form of a laminated film of the resin layer and the coloring agent layer, the adhesive layers 30 and 32 preferably have a laminated state of a resin layer/a coloring agent layer/a resin layer. In this case, the two resin layers on both sides of the coloring agent layer may be resin layers having the same composition or may be resin layers having different compositions.

Other additives can be appropriately compounded in the adhesive layers 30 and 32 as necessary. Examples of the other additives include a filler, a flame retardant, a silane coupling agent, an ion trapping agent, an extender, an anti-aging agent, an antioxidant, and a surfactant.

The filler may be any of an inorganic filler and an organic filler. However, an inorganic filler is preferable. By adding a filler such as an inorganic filler, electric conductivity can be given to the adhesive layers 30 and 32, heat conductivity can be improved, and the elastic modulus can be adjusted. The adhesive layers 30 and 32 may be electrically conductive or non-conductive. Examples of the inorganic filler include ceramics such as silica, clay, gypsum, calcium carbonate, barium sulfate, alumina oxide, beryllium oxide, silicon carbide, and silicon nitride, metals such as aluminum, copper, silver, gold, nickel, chromium, lead, tin, zinc, palladium, and solder, alloys, and various inorganic powders consisting of carbon. The fillers may be used alone or two types or more can be used together. Among these, silica, especially molten silica is preferable. The average particle size of the inorganic filler is preferably in a range of 0.1 to 80 µm. The average particle size of the inorganic filler can be measured with a laser diffraction type particle size distribution device, for example.

The compounding amount of the filler (especially, the inorganic filler) is preferably 80 parts by weight or less (0 to 80 parts by weight), and especially preferably 0 to 70 parts by weight to 100 parts by weight of the organic resin component.

Examples of the flame retardant include antimony trioxide, antimony pentoxide, and a brominated epoxy resin. These can be used alone or two types or more can be used together.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The adhesive layers 30 and 32 can be formed by a common method of preparing a resin composition by mixing a thermosetting resin such as an epoxy resin, a thermoplastic resin such as an acrylic resin as necessary, and a solvent and other additives as necessary and forming the resin composition into a film-like layer.

When the adhesive layers 30 and 32 are formed of a resin composition containing a thermosetting resin such as an epoxy resin, the thermosetting resin in the adhesive layers 30 and 32 is uncured or is partially cured at the stage before application to a semiconductor wafer. In this case, the thermosetting resin in the adhesive layers 30 and 32 is completely cured or almost completely cured after application to a semiconductor wafer (normally when curing a sealing material in a flip-chip bonding step).

Even if the adhesive layers 30 and 32 contain the thermosetting resin, since the thermosetting resin is uncured or is partially cured, the gel fraction of the adhesive layers 30 and 32 is not especially limited. The gel fraction can be appropriately selected from a range of 50% by weight or less (0 to 50% by weight), preferably 30% by weight or less (0 to 30% by weight), and especially preferably 10% by weight or less (0 to 10% by weight). The gel fraction of the adhesive layer can be measured by the following method.

<Method of Measuring Gel Fraction>

About 0.1 g of a sample (sample weight) is precisely weighed from the adhesive layer, the sample is wrapped with a mesh sheet, and then the sample is immersed in about 50 ml of toluene at room temperature for a week. After that, the portion insoluble in the solvent (content of the mesh sheet) is taken out of toluene and dried at 130° C. for about 2 hours, and after drying, the portion insoluble in the solvent is weighed (weight after immersion and drying), and the gel fraction (% by weight) is calculated from the following formula (a).

Gel fraction (% by weight)=[(Weight after immersion and drying)/(Sample weight)]×100     (a)

The gel fraction of the adhesive layer can be controlled by the type and the content of the resin component, the type and the content of the crosslinking agent, the heating temperature, the heating time, and the like.

When the adhesive layer in the present invention is a film that is formed with a resin composition containing a thermosetting resin such as an epoxy resin, adhesion to a semiconductor wafer can be exhibited effectively.

The tensile storage modulus at 23° C. of the uncured films 40 and 41 for the backside of a semiconductor is preferably 1 GPa or more (1 to 50 GPa, for example), more preferably 2 GPa or more, and especially preferably 3 GPa or more. When the tensile storage modulus is 1 GPa or more, adhesion of the film for the backside of a semiconductor to a support can be effectively suppressed or prevented when a semiconductor chip is peeled from the pressure-sensitive adhesive layer 22 of a dicing tape together with the films 40 and 41 for the backside of a semiconductor and the films 40 and 41 for the backside of a semiconductor mounted on the support are transported. Examples of the support include a top tape and a bottom tape of a carrier tape.

The tensile storage modulus (23° C.) in the uncured portion of the film for the backside of a semiconductor can be controlled by the type and the content of the resin component (a thermoplastic resin and a thermosetting resin), the type and the content of the filler such as a silica filler, and the like.

As for the case where the adhesive layers 30 and 32 are a laminated film in which a plurality of layers are laminated (when the film for the backside of a semiconductor has a lamination form), examples of the lamination form include a lamination form consisting of a wafer adhesive layer and a laser marking layer. Other layers such as an intermediate layer, a light beam shielding layer, a reinforcing layer, a coloring agent layer, a base layer, an electromagnetic wave shielding layer, a heat conducting layer, and a pressure-sensitive adhesive layer may be provided between the wafer adhesive layer and the laser marking layer. The wafer adhesive layer is a layer having excellent adhesion (tackiness) to a wafer and contacting with the backside of the wafer. The laser marking layer is a layer having an excellent laser marking property and is used to perform laser marking on the backside of a semiconductor chip.

The uncured films 40 and 41 for the backside of a semiconductor was produced without laminating the films on the dicing tape 2, and the tensile storage modulus was measured using a dynamic viscoelasticity measurement apparatus (Solid Analyzer RS A2) manufactured by Rheometric Scientific FE, Ltd. in tensile mode, sample width 10 mm, sample length 22.5 mm, sample thickness 0.2 mm, frequency 1 Hz, temperature rise rate 10° C./min, under a nitrogen atmosphere, and at a prescribed temperature (23° C.).

At least one of the surfaces of the films 40 and 41 for the backside of a semiconductor is preferably protected by a separator (a release liner, not shown in the drawings). In a case of a dicing tape-integrated film 1 (refer to FIG. 3) for the backside of a semiconductor, the separator may be provided only on one surface of the film for the backside of a semiconductor. On the other hand, in the case of a film for the backside of a semiconductor that is not integrated with the dicing tape, the separator may be provided on one surface or both surfaces of the film for the backside of a semiconductor. The separator has a function of protecting the film for the backside of a semiconductor as a protective material until the film is used. In the case of the dicing tape-integrated film 1 for the backside of a semiconductor, the separator can be further used as a support base when transferring the film 40 for the backside of a semiconductor to the pressure-sensitive adhesive layer 22 on the base of the dicing tape. The separator is peeled when pasting the semiconductor wafer onto the film for the backside of a semiconductor. Examples of the separator include polyethylene, polypropylene, a plastic film such as polyethylene terephthalate whose surface is coated with a release agent such as a fluorine release agent or a long chain alkylacrylate release agent, and paper. The separator can be formed by a conventionally known method. The thickness of the separator is also not especially limited.

When the films 40 and 41 for the backside of a semiconductor are not laminated on the dicing tape 2, the films 40 and 41 for the backside of a semiconductor may be protected by the separator having a release layer on both surfaces in a form of being wound up in a roll using one sheet of the separator, or may be protected by a separator having a release layer on at least on one of the surfaces.

The light transmittance (visible light transmittance) of visible light (having a wavelength of 400 to 800 nm) in the films 40 and 41 for the backside of a semiconductor is not especially limited, and is preferably in a range of 20% or less (0 to 20%), more preferably 10% or less (0 to 10%), and especially preferably 5% or less (0 to 5%). When the visible light transmittance of the films 40 and 41 for the backside of a semiconductor is larger than 20%, there is a fear that a bad influence may be given to the semiconductor element when the light beam passes. The visible light transmittance (%) can be controlled by the type and the content of the resin component of the films 40 and 41 for the backside of a semiconductor, the type and the content of the coloring agent such as a pigment or a dye, the content of the inorganic filler, and the like.

The visible light transmittance (%) of the film for the backside of a semiconductor can be measured as follows. That is, a film for the backside of a semiconductor having a thickness (average thickness) of 20 μm is produced. The film for the backside of a semiconductor is then irradiated with visible light having a wavelength of 400 to 800 nm (a visible light generator "Absorption Spectro Photometer" manufactured by Shimadzu Corporation) at a prescribed intensity, and the intensity of the transmitted visible light beam is measured. The visible light transmittance can be obtained from a change of the intensity before and after the visible light beam transmits through the film for the backside of a semiconductor. It is also possible to obtain the visible light transmittance (%; wavelength: 400 to 800 nm) of the film for the backside of a semiconductor having a thickness of 20 μm from the visible light transmittance (%; wavelength: 400 to 800 nm) of the film for the backside of a semiconductor whose thickness is not 20 μm. The visible light transmittance (%) of the film for the backside of a semiconductor having a thickness of 20 μm is obtained in the present invention. However, the thickness of the film for the backside of a semiconductor according to the present invention is not limited to 20 μm.

The coefficient of moisture absorption of the films 40 and 41 for the backside of a semiconductor is preferably low. Specifically, the coefficient of moisture absorption is preferably 1% by weight or less, and more preferably 0.8% by weight or less. By making the coefficient of moisture absorption 1% by weight or less, the laser marking property can be improved. Further, generation of voids between the films 40 and 41 for the backside of a semiconductor and the semiconductor element can be suppressed or prevented in a reflow step, for example. The coefficient of moisture absorption is a value calculated from the weight change before and after the films 40 and 41 for the backside of a semiconductor are left under an atmosphere of a temperature of 85° C. and a relative humidity of 85% RH for 168 hours. When the films 40 and 41 for the backside of a semiconductor are formed of a resin composition containing a thermosetting resin, the coefficient of moisture absorption is a value obtained the films for the backside of a semiconductor after thermal curing are left under an atmosphere of a temperature of 85° C. and a relative humidity of 85% RH for 168 hours. The coefficient of moisture absorption can be adjusted by changing the added amount of the inorganic filler, for example.

The ratio of the volatile component of the films 40 and 41 for the backside of a semiconductor is preferably small. Specifically, the weight decrease rate (ratio of the weight decrease amount) of the films 40 and 41 for the backside of a semiconductor after a heat treatment is preferably 1% by weight or less, and more preferably 0.8% by weight or less. The condition of the heating treatment is a heating temperature of 250° C. and a heating time of 1 hour, for example. By making the weight decrease rate 1% by weight or less, the laser marking property can be improved. The generation of cracks in the flip-chip type semiconductor device can be suppressed or prevented in a reflow step, for example. The weight decrease rate can be adjusted by adding an inorganic substance that can decrease the generation of cracks during a lead free solder reflow, for example. When the films 40 and 41 for the backside of a semiconductor are formed with a resin composition containing a thermosetting resin, the weight decrease rate means a value obtained when the film for the backside of a semiconductor after thermal curing is heated under conditions of a heating temperature of 250° C. and a heating time of 1 hour.

The thickness of the film for the backside of semiconductors 40 and 41 (the total thickness including the electromagnetic wave shielding layer and the adhesive layer) is not especially limited. The thickness can be selected from a range of 1 to 10000 μm for example, preferably 2 to 900 μm, and more preferably 3 to 800 μm.

The thickness of the adhesive layers 30 and 32 is not especially limited. The thickness can be selected so that the thickness of the film for the backside of semiconductors 40 and 41 is in the above-described range and is, for example, 1 to 200 μm, preferably 2 to 150 μm, and more preferably 3 to 100 μm.

The film for the backside of a flip-chip type semiconductor according to this embodiment can be used as a dicing tape-integrated film for the backside of a semiconductor by laminating on a dicing tape. The dicing tape is not especially limited, and a tape in which a pressure-sensitive adhesive layer is laminated on a base can be adopted, for example. The dicing tape-integrated film for the backside of a semiconductor is explained below in which the film for the backside of a flip-chip type semiconductor according to the above-described embodiment is laminated on a dicing tape.

(Dicing Tape-Integrated Film for the Backside of Semiconductor)

Figure 3:
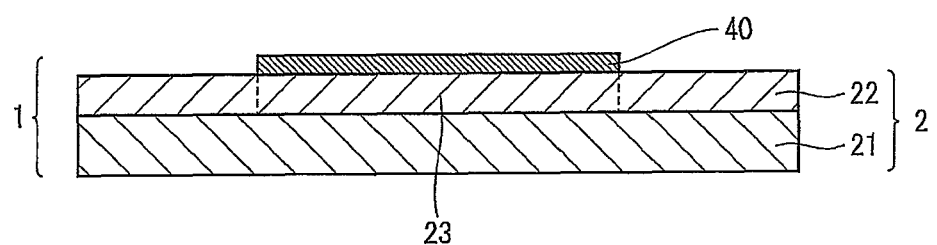
FIG. 3 is a sectional schematic drawing showing one example of the dicing tape-integrated film for the backside of a semiconductor according to one embodiment of the present invention.

FIG. 3 is a sectional schematic drawing showing one example of the dicing tape-integrated film for the backside of a semiconductor according to this embodiment. As shown in FIG. 3, the dicing tape-integrated film 1 for the backside of a semiconductor has a configuration including the dicing tape 2 in which the pressure-sensitive adhesive layer 22 is provided on the base 21 and the film 40 for the backside of a semiconductor. As shown in FIG. 3, the dicing tape-integrated film for the backside of a semiconductor of the present invention may have a configuration in which the adhesive layer 30 is formed only on a portion 23 corresponding to a semiconductor wafer pasting portion on the pressure-sensitive adhesive layer 22 of the dicing tape 2. However, the film may have a configuration in which the film for the backside of a semiconductor is formed on the entire surface of the pressure-sensitive adhesive layer 22 or a configuration in which the film for the backside of a semiconductor is formed on a portion that is larger than the portion 23 corresponding to the semiconductor wafer pasting portion and smaller than the entire surface of the pressure-sensitive adhesive layer 22. The surface (the surface that is pasted to the backside of a wafer) of the film 40 for the backside of a semiconductor may be protected by a separator or the like until it is pasted to the backside of a wafer.

(Dicing Tape)

The dicing tape 2 has a configuration in which the pressure-sensitive adhesive 22 is formed on the base 21. As described above, the dicing tape may have a configuration in which the base 21 and the pressure-sensitive adhesive layer 22 are laminated. The base (support base) can be used as a support base body of the pressure-sensitive adhesive layer, and the like. The base 21 preferably has radiation transparency. Examples of the base 21 include appropriate thin materials including paper bases such as paper; fiber bases such as cloth, unwoven cloth, felt, and net; metal bases such as a metal foil and a metal plate; plastic bases such as a plastic film and sheet; rubber bases such as a rubber sheet; foams such as a foamed sheet, and laminated bodies of these (especially laminated bodies of a plastic base and other bases and laminated bodies of plastic films or sheets). In the present invention, a plastic base such as a plastic film or sheet can be preferably used as the base. Examples of the material of such a plastic base include olefin resins such as polyethylene (PE), polypropylene (PP), and an ethylene-propylene copolymer; copolymers having ethylene as a monomer component such as a ethylene vinyl acetate copolymer (EVA), an ionomer resin, a ethylene-(meth)acrylate copolymer, and an ethylene-(meth)acrylate (random, alternating) copolymer; polyesters such as polyethylene terephthalate (PET), polyethylene naphthalate (PEN), and polybutylene terephthalate (PBT); an acrylic resin; polyvinyl chloride (PVC); polyurethane; polycarbonate; polyphenylene sulfide (PPS); amide resins such as polyamide (nylon) and fully aromatic polyamide (aramid); polyether ether ketone (PEEK); polyimide; polyetherimide; polyvinylidene chloride; ABS (acrylonitrile-butadiene-styrene copolymer); a cellulose resin; a silicone resin; and a fluororesin.

Further, the material of the base 21 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 22 and the adhesive layer 30 are reduced by thermally shrinking the base 21 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 21 in order to improve adhesiveness, holding properties, etc. with the adjacent layer.

The same type or different types can be appropriately selected and used as the base 21, and several types can be blended and used as necessary. A vapor deposited layer of a conductive substance having a thickness of about 30 to 500 Å consisting of metals, alloys, and oxides of these can be provided on the base 21 to give an antistatic function to the base 21. The base 21 may be a single layer or a multilayer consisting of two types or more layers.

The thickness of the base 21 (total thickness in the case of a laminated body) is not especially limited, and can be appropriately selected according to the strength, flexibility, purpose of use, and the like. For example, the thickness is generally 1000 μm or less (1 to 1000 μm, for example), preferably 10 to 500 μm, more preferably 20 to 300 μm, and especially preferably about 30 to 200 μm. However, the thickness is not limited to these ranges.

The base 21 may contain various additives such as a coloring agent, a filler, a plasticizer, an anti-aging agent, an antioxidant, a surfactant, and a flame retardant as long as the effects of the present invention are not deteriorated.

The pressure-sensitive adhesive layer 22 is formed with a pressure-sensitive adhesive, and has adherability. The pressure-sensitive adhesive is not especially limited, and can be appropriately selected among known pressure-sensitive adhesives. Specifically, known pressure-sensitive adhesives (refer to Japanese Patent Application Laid-Open Nos. 56-61468, 61-174857, 63-17981, and 56-13040, for example) such as a pressure-sensitive adhesive having the above-described characteristics can be appropriately selected from an acrylic pressure-sensitive adhesive, a rubber pressure-sensitive adhesive, a vinylalkylether pressure-sensitive adhesive, a silicone pressure-sensitive adhesive, a polyester pressure-sensitive adhesive, a polyamide pressure-sensitive adhesive, a urethane pressure-sensitive adhesive, a fluorine pressure-sensitive adhesive, a styrene-diene block copolymer pressure-sensitive adhesive, and a creep property improved pressure-sensitive adhesive in which a hot-melt resin having a melting point of about 200° C. or less is compounded in these pressure-sensitive adhesives. A radiation curing type pressure-sensitive adhesive (or an energy ray curing type pressure-sensitive adhesive) and a thermally expandable pressure-sensitive adhesive can also be used as the pressure-sensitive adhesive. The pressure-sensitive adhesives can be used alone or two types or more can be used together.

An acrylic pressure-sensitive adhesive and a rubber pressure-sensitive adhesive can be suitably used as the pressure-sensitive adhesive, and especially an acrylic pressure-sensitive adhesive is suitable. An example of the acrylic pressure-sensitive adhesive is an acrylic pressure-sensitive adhesive having an acrylic polymer, in which one type or two types or more of alkyl(meth)acrylates are used as a monomer component, as a base polymer.

Examples of alkyl(meth)acrylates in the acrylic pressure-sensitive adhesive include methyl(meth)acrylate, ethyl(meth)acrylate, propyl(meth)acrylate, isopropyl (meth)acrylate, butyl(meth)acrylate, isobutyl(meth)acrylate, s-butyl(meth)acrylate, t-butyl(meth)acrylate, pentyl (meth)acrylate, hexyl (meth)acrylate, heptyl(meth)acrylate, octyl(meth)acrylate, 2-ethylhexyl(meth)acrylate, isooctyl (meth)acrylate, nonyl (meth)acrylate, isononyl(meth)acrylate, decyl(meth)acrylate, isodecyl(meth)acrylate, undecyl (met)acrylate, dodecyl (meth)acrylate, tridecyl (meth)acrylate, tetradecyl(meth) acrylate, pentadecyl (meth)acrylate, hexadecyl(meth) acrylate, heptadecyl (meth)acrylate, octadecyl(meth) acrylate, nonadecyl (meth)acrylate, and eicosyl(meth)acrylate. Alkyl (meth)acrylates having an alkyl group of 4 to 18 carbon atoms is suitable. The alkyl group of alkyl(meth)acrylates may be any of linear or branched chain.

The acrylic polymer may contain units that correspond to other monomer components that is copolymerizable with alkyl (meth)acrylates described above (copolymerizable monomer component) for reforming cohesive strength, heat resistance, and crosslinking property, as necessary. Examples of such copolymerizable monomer components include carboxyl group-containing monomers such as (meth)acrylic acid (acrylic acid, methacrylic acid), carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl group-containing monomers such as hydroxyethyl (meth)acrylate, hydroxypropyl(meth)acrylate, hydroxybutyl (meth)acrylate, hydroxyhexyl(meth)acrylate, hydroxyoctyl (meth)acrylate, hydroxydecyl(meth)acrylate, hydroxylauryl (meth)acrylate, and (4-hydroxymethylcyclohexyl)methyl methacrylate; sulfonate group-containing monomers such as styrenesulfonic acid, allylsulfonic acid, 2-(meth)acrylamide-2-methylpropanesulfonic acid, (meth) acrylamidepropanesulfonic acid, sulfopropyl(meth)acrylate, and (meth) acryloyloxynaphthalenesulfonic acid; phosphate group-containing monomers such as 2-hydroxyethylacryloylphosphate; (N-substituted) amide monomers such as (meth)acrylamide, N,N-dimethyl(meth)acrylamide, N-butyl(meth)acrylamide, N-methylol(meth)acrylamide, and N-methylolpropane (meth)acrylamide; aminoalkyl(meth)acrylate monomers such as aminoethyl(meth)acrylate, N,N-dimethlaminoethyl (meth)acrylate, and t-butylaminoethyl (meth)acrylate; alkoxyalkyl(meth)acrylate monomers such as methoxyethyl (meth)acrylate and ethoxyethyl(meth)acrylate; cyanoacrylate monomers such as acrylonitrile and methacrylonitrile; epoxy group-containing acrylic monomers such as glycidyl (meth)acrylate; styrene monomers such as styrene and α-methylstyrene; vinylester monomers such as vinyl acetate and vinyl propionate; olefin monomers such as isoprene, butadiene, and isobutylene; vinylether monomers such as vinylether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylene succinimide, N-(meth)acryloyl-6-oxyhexamethylene succinimide, and N-(meth)acryloyl-8-oxyoctamethylene succinimide; glycol acrylester monomers such as polyethylene glycol (meth)acrylate, polypropylene glycol (meth)acrylate, metoxyethylene glycol (meth)acrylate, and metoxypolypropylene glycol (meth)acrylate; acrylate monomers having a heterocyclic ring, a halogen atom, a silicon atom, and the like such as tetrahydrofurfuryl(meth)acrylate, fluorine (meth)acrylate, and silicone (meth)acrylate; and polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxyacrylate, polyesteracrylate, urethaneacrylate, divinylbenzene, butyl di(meth)acrylate, and hexyldi(meth)acrylate. One type or two types or more of these copolymerizable monomer components can be used.

When a radiation curing type pressure-sensitive adhesive (or an energy ray curing type pressure-sensitive adhesive) is used as the pressure-sensitive adhesive, examples of the radiation curing type pressure-sensitive adhesive (composition) include an internal radiation curing type pressure-sensitive adhesive having a polymer with a radical reactive carbon-carbon double bond in the polymer side chain, the main chain, or the ends of the main chain as a base polymer and a radiation curing type pressure-sensitive adhesive in which ultraviolet-ray curing-type monomer component and oligomer component are compounded in the pressure-sensitive adhesive. When a thermally expandable pressure-sensitive adhesive is used as the pressure-sensitive adhesive, examples thereof include a thermally expandable pressure-sensitive adhesive containing a pressure-sensitive adhesive and a foaming agent (especially, a thermally expandable microsphere).

The pressure-sensitive adhesive layer 22 of the present invention may contain various additives such as a tackifier, a coloring agent, a thickener, an extender, a filler, a plasticizer, an anti-aging agent, an antioxidant, a surfactant, and a crosslinking agent as long as the effects of the present invention are not deteriorated.

The crosslinking agent is not especially limited, and known crosslinking agents can be used. Specific examples of the crosslinking agent include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent, and an isocyanate crosslinking agent and an epoxy crosslinking agent are preferable. The crosslinking agents can be used alone or two types or more can be used together. The used amount of the crosslinking agent is not especially limited.

Examples of the isocyanate crosslinking agent include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimeric adduct (Coronate L manufactured by Nippon Polyurethane Industry Co., Ltd.), and a trimethylolpropane/hexamethylene diisocyanate trimeric adduct (Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerithritol polyglycidylether, polyglycerol polyglycidylether, sorbitan polyglycidylether, trimethylolpropane polyglycidylether, diglycidyl adipate, o-diglycidyl phthalate, triglycidyl-tris(2-hydroxyethyl) isocyanurate, resorcin diglycidylether, bisphenol-5-diglycidylether; and an epoxy resin having two or more epoxy groups in a molecule.

In the present invention, a crosslinking treatment can be performed by irradiation with an electron beam, an ultraviolet ray, or the like instead of using the crosslinking agent or in addition to the use of the crosslinking agent.

The pressure-sensitive adhesive layer 22 can be formed by a common method of forming a sheet-like layer by mixing the pressure-sensitive adhesive with a solvent, other additives, and the like as necessary. Specifically, the pressure-sensitive adhesive layer 22 can be produced by a method of applying the pressure-sensitive adhesive or a mixture containing the pressure-sensitive adhesive, a solvent and other additives to the base 21, a method of forming the pressure-sensitive adhesive layer 22 by applying the above-described mixture to an appropriate separator (release paper, for example), and transferring (adhering) the resultant onto the base 21, for example.

The thickness of the pressure-sensitive adhesive layer 22 is not especially limited, and is about 5 to 300 μm (preferably 5 to 200 μm, more preferably 5 to 100 μm, and especially preferably 7 to 50 μm). When the thickness of the pressure-sensitive adhesive layer 22 is in the above-described range, adequate adhesive power can be exhibited. The pressure-sensitive adhesive layer 22 may be a single layer or a plurality of layers.

In the present invention, an antistatic function can be given to the films 40 and 41 for the backside of a flip-chip type semiconductor and the dicing tape-integrated film 1 for the backside of a semiconductor. With this configuration, generation of static electricity on the films during adhesion and peeling and damages of the circuit due to electrification of the semiconductor wafer, and the like can be prevented. The antistatic function can be given by an appropriate method such as a method of adding an antistatic agent or a conductive substance to the base 21, the pressure-sensitive adhesive layer 22, or the films 40 and 41 for the backside of a flip-chip type semiconductor and a method of providing a conductive layer made of a charge-transfer complex or a metal film to the base 21. A method of giving the antistatic function is preferable with which impurity ions that can deteriorate the semiconductor wafer are hardly generated. Examples of the conductive substance (conductive filler) that is compounded to give electric conductivity and to improve heat conductivity include spherical, needle-like, and flaky metal powders of silver, aluminum, gold, copper, nickel, and conductive alloys, metal oxides of alumina, amorphous carbon black, and graphite. However, the films 40 and 41 for the backside of a flip-chip type semiconductor are preferably electrically non-conductive from the viewpoint of making the films have no electrical leakage.

The films 40 and 41 for the backside of a flip-chip type semiconductor and the dicing tape-integrated film 1 for the backside of a semiconductor may be formed in a form in which the films are wound into a roll or a form in which the films are laminated. When the films have a form in which they are wound into a roll, the film for the backside of a flip-chip type semiconductor or a dicing tape-integrated film for the backside of a semiconductor having a form in which the films are wound into a roll can be produced by winding the film for the backside of a flip-chip type semiconductor or a laminated body of the film for the backside of a flip-chip type semiconductor and the dicing tape into a roll while protecting the film or the laminated body with a separator as necessary. The dicing tape-integrated film 1 for the backside of a semiconductor that is wound into a roll may be configured with the base 21, the pressure-sensitive adhesive layer 22 that is formed on one side of the base 21, a film for the backside of a semiconductor that is formed on the pressure-sensitive adhesive layer 22, and a release treatment layer (a back treatment layer) that is formed on the other surface of the base 21.

The thickness of the dicing tape-integrated film 1 for the backside of a semiconductor (total thickness of the film for the backside of a semiconductor and the dicing tape consisting of the base 21 and the pressure-sensitive adhesive layer 22) can be selected from a range of 7 to 11300 μm, and is preferably 17 to 1600 μm, and more preferably 28 to 1200 μm.

By controlling the ratio between the thickness of the film for the backside of a flip-chip type semiconductor and the thickness of the pressure-sensitive adhesive layer of the dicing tape and the ratio between the thickness of the film for the backside of a flip-chip type semiconductor and the thickness of the dicing tape (total thickness of the base and the pressure-sensitive adhesive layer) in the dicing tape-integrated film for the backside of a semiconductor, the dicing property in a dicing step, the pickup property in a pickup step, and the like can be improved, and the dicing tape-integrated film for the backside of a semiconductor can be effectively used from the dicing step of a semiconductor wafer to the flip-chip bonding step of a semiconductor chip.

(Method of Manufacturing Film for the Backside of Semiconductor)

A method of manufacturing the film for the backside of semiconductors 40 and 41 is explained. First, an adhesive composition solution that is a forming material of the adhesive layer 30 is produced. A filler, various additives, and the like may be compounded in the adhesive composition solution in addition to the adhesive composition as necessary.

The adhesive layer 30 is formed by forming a coating film by applying the adhesive composition solution onto a base separator to have a prescribed thickness and drying the coating film under a prescribed condition. The coating method is not especially limited. Examples thereof include roll coating, screen coating, and gravure coating. An example of the drying condition is a drying temperature of 70 to 160° C. and a drying time of 1 to 5 minutes.

Next, the electromagnetic wave shielding layer 31 is formed on the adhesive layer 30. The electromagnetic wave shielding layer 31 can be formed by a sputtering method, a vapor deposition method such as a CVD method or a vacuum vapor deposition method, a plating method, an immersion method, or a painting method using the above-described materials. The electromagnetic wave shielding layer 31 can be formed also by pressure-bonding the above-described material previously made into a film (a metal foil, for example) to the adhesive layer 30. By the above-described processes, the film for the backside of semiconductor 40 can be obtained.

The film for the backside of semiconductor 41 can be obtained by further forming the adhesive layer 32 on the electromagnetic wave shielding layer 31. A material (adhesive composition) for forming the adhesive layer 32 is applied onto a release paper to a prescribed thickness and a coating layer is formed under a prescribed condition. The film for the backside of semiconductor 41 is formed by transferring this coating layer onto the electromagnetic wave shielding layer 31. The adhesive layer 32 can be formed also by applying the forming material directly onto the electromagnetic wave shielding layer 31 and then drying the material under a prescribed condition.

(Method of Manufacturing Dicing Tape-integrated Film for the Backside of Semiconductor)

A method of manufacturing the dicing tape-integrated film for the backside of a semiconductor according to this embodiment is explained using the dicing tape-integrated film 1 for the backside of a semiconductor shown in FIG. 3 as an example. First, the base 21 can be formed by a conventionally known film forming method. Examples of the film forming method include a calender film forming method, a casting method in an organic solvent, an inflation extrusion method in a closed system, a T die extrusion method, a co-extrusion method, and a dry laminating method.

The pressure-sensitive adhesive layer 22 is formed by applying a pressure-sensitive adhesive composition to the base 21 and drying the composition (by crosslinking by heat as necessary). Examples of the application method include roll coating, screen coating, and gravure coating. The pressure-sensitive adhesive layer 22 may be formed on the base 21 by applying the pressure-sensitive adhesive composition directly to the base 21, or the pressure-sensitive adhesive layer 22 may be transferred to the base 21 after the pressure-sensitive adhesive layer 22 is formed by applying the pressure-sensitive adhesive composition to a release paper whose surface has been subjected to a release treatment. With this configuration, the dicing tape 2 is produced in which the pressure-sensitive adhesive layer 22 is formed on the base 21.

The adhesive layer 30 of the previously manufactured film for the backside of semiconductor 40 and the pressure-sensitive adhesive layer 22 are pasted together so that these layers form a pasting surface. Pasting can be performed by pressure-bonding, for example. At this time, the lamination temperature is not especially limited. The temperature is preferably 30 to 50° C. and more preferably 35 to 45° C. The linear pressure is not especially limited. The pressure is preferably 0.1 to 20 kgf/cm, and more preferably 1 to 10 kgf/cm. Next, the dicing tape-integrated film for the backside of semiconductor 1 according to the present embodiment can be obtained by peeling the base separator on the adhesive layer. The dicing tape-integrated film for the backside of semiconductor 1 can also be obtained by directly forming the adhesive layer 30, the electromagnetic wave shielding layer 31, and the adhesive layer 22 sequentially on the pressure-sensitive adhesive layer 2. In this case, the method of forming the adhesive layer 30 and the electromagnetic wave shielding layer 31 may be the same as the method of manufacturing the above-described film for the backside of semiconductor 40. When thermal curing is performed to form the film 40 for the backside of a semiconductor, it is important to perform thermal curing up to a level at which the film is partially cured. However, it is preferable not to perform thermal curing.

The dicing tape-integrated film 1 for the backside of a semiconductor of the present invention can be used suitably in the manufacture of a semiconductor device having a flip-chip connecting step. The dicing tape-integrated film 1 for the backside of a semiconductor of the present invention is used to manufacture a flip-chip mounted semiconductor device, and the flip-chip mounted semiconductor device is manufactured in a form in which the film 40 for the backside of a semiconductor of the dicing tape-integrated film 1 for the backside of a semiconductor is pasted to the backside of the semiconductor chip. Therefore, the dicing tape-integrated film 1 for the backside of a semiconductor of the present invention can be used for a flip-chip mounted semiconductor device (a semiconductor device in a form in which the semiconductor chip is fixed to an adherend such as a substrate by a flip-chip bonding method).

The film 40 for the backside of a semiconductor can be used for a flip-chip mounted semiconductor device (a semiconductor device having a form in which the semiconductor chip is fixed to an adherend such as a substrate by a flip-chip bonding method) similarly to the dicing tape-integrated film 1 for the backside of a semiconductor.

(Semiconductor Wafer)

The semiconductor wafer is not especially limited as long as it is a known or common semiconductor wafer, and semiconductor wafers made of various materials can be appropriately selected and used. In the present invention, a silicon wafer can be suitably used as the semiconductor wafer.

(Method of Manufacturing Semiconductor Device)

Figure 4:
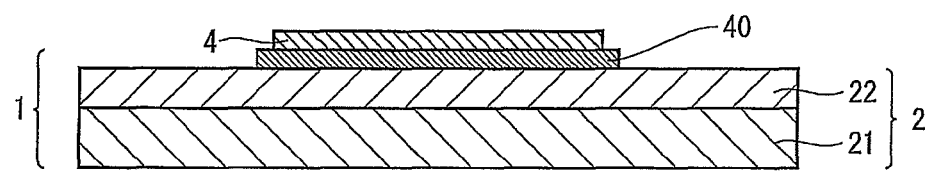
FIGS. 4A to 4D are sectional schematic drawings showing one example of a method of manufacturing a semiconductor device using the dicing tape-integrated film for the backside of a semiconductor according to one embodiment of the present invention.
Figure 4:
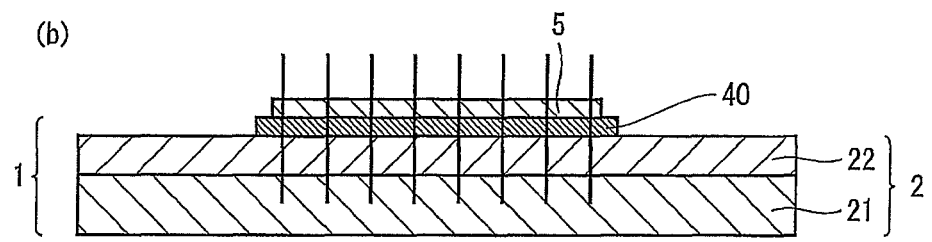
Figure 4:
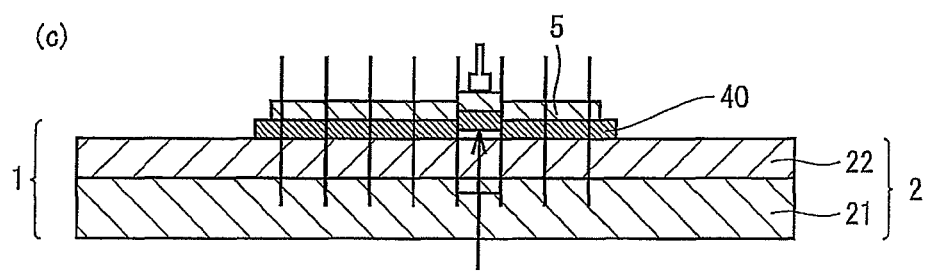
Figure 4:
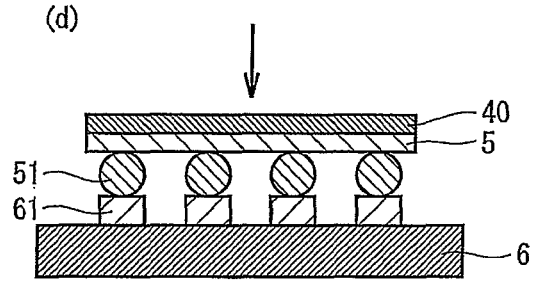
Figure 5:
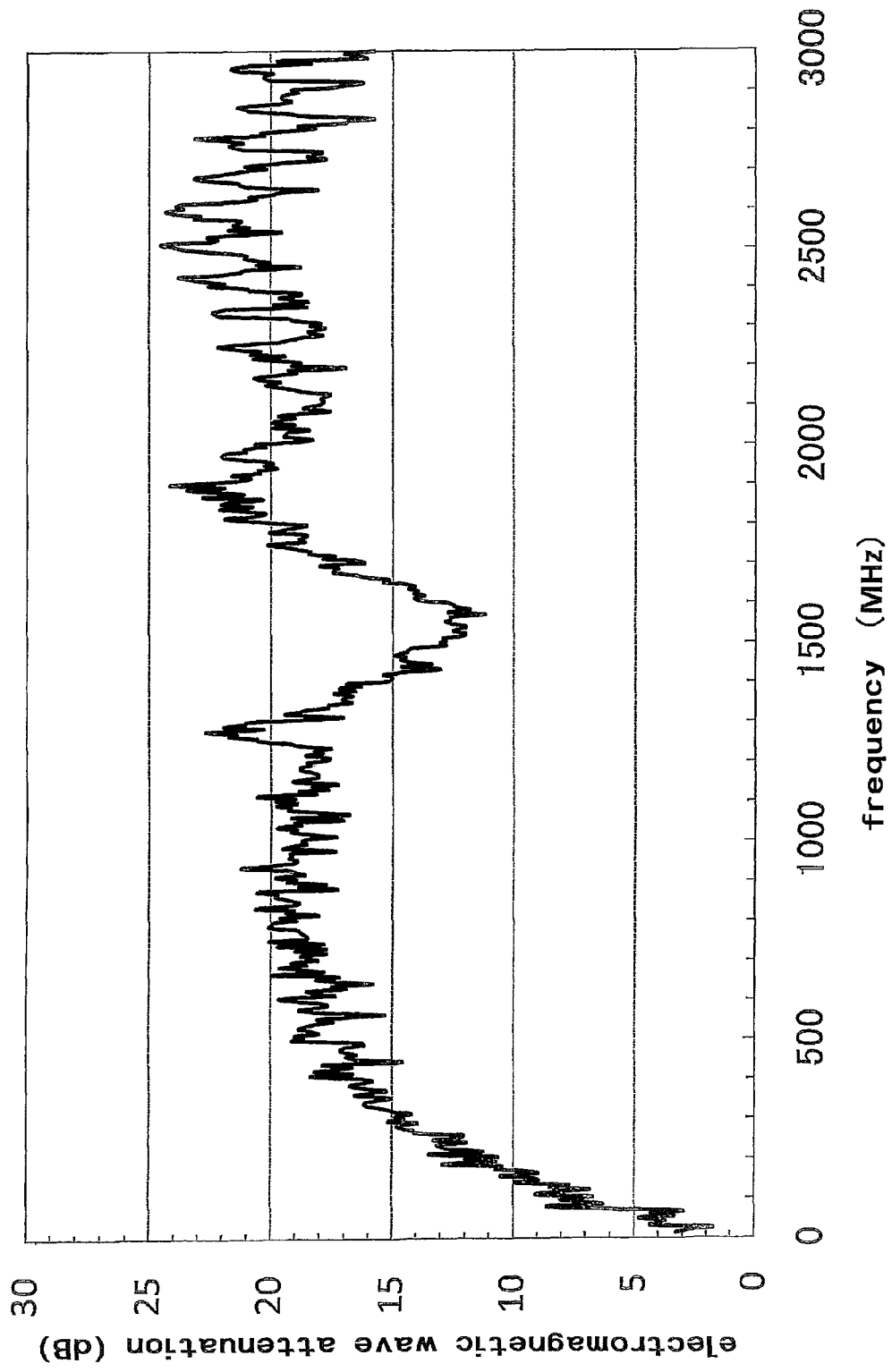
FIG. 5 is a graph showing a measurement result of electromagnetic wave attenuation (dB) of the film for the backside of a flip-chip type semiconductor according to Example 1.
Figure 6:
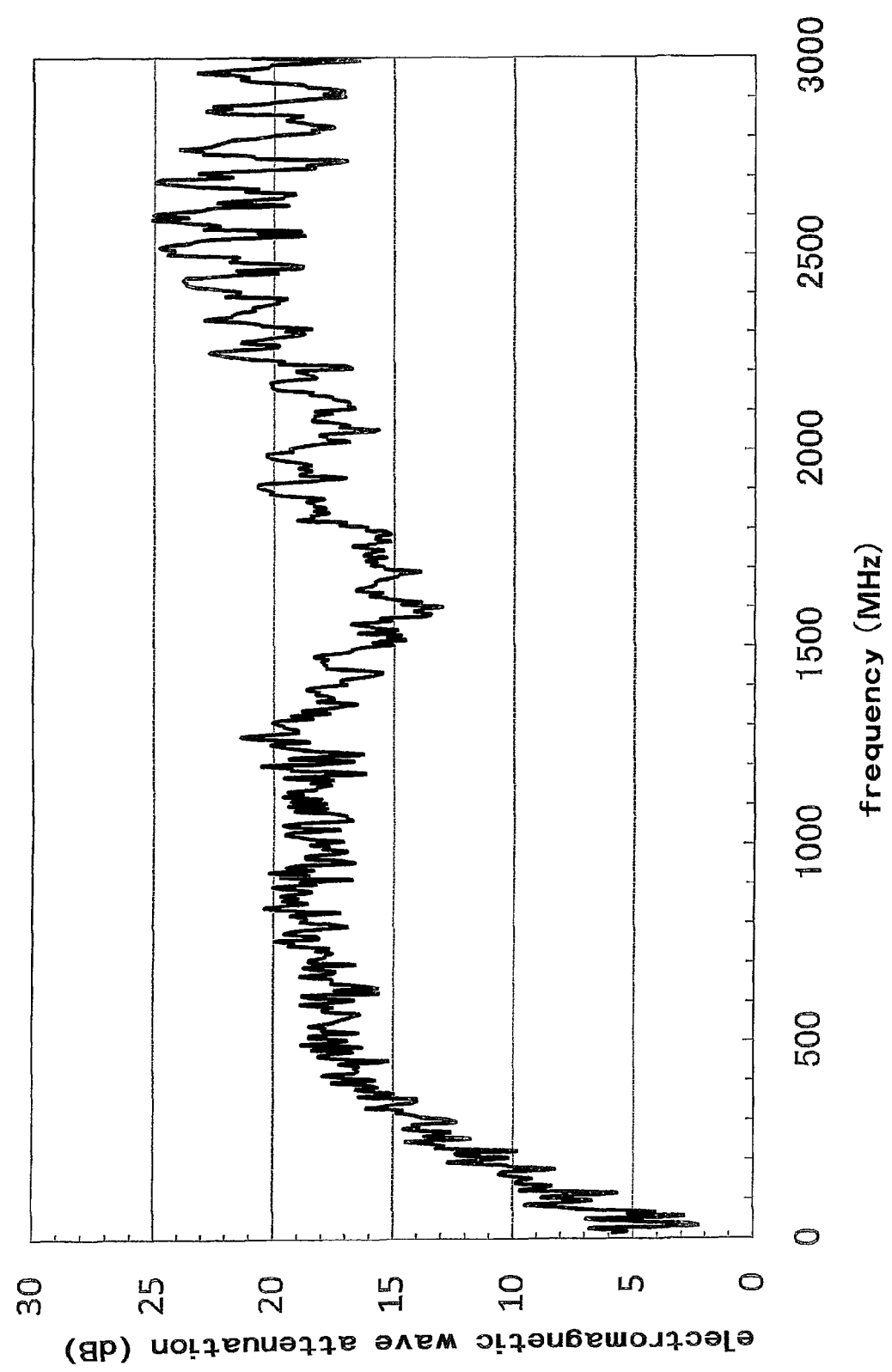
FIG. 6 is a graph showing a measurement result of electromagnetic wave attenuation (dB) of the film for the backside of a flip-chip type semiconductor according to Example 2.
Figure 7:
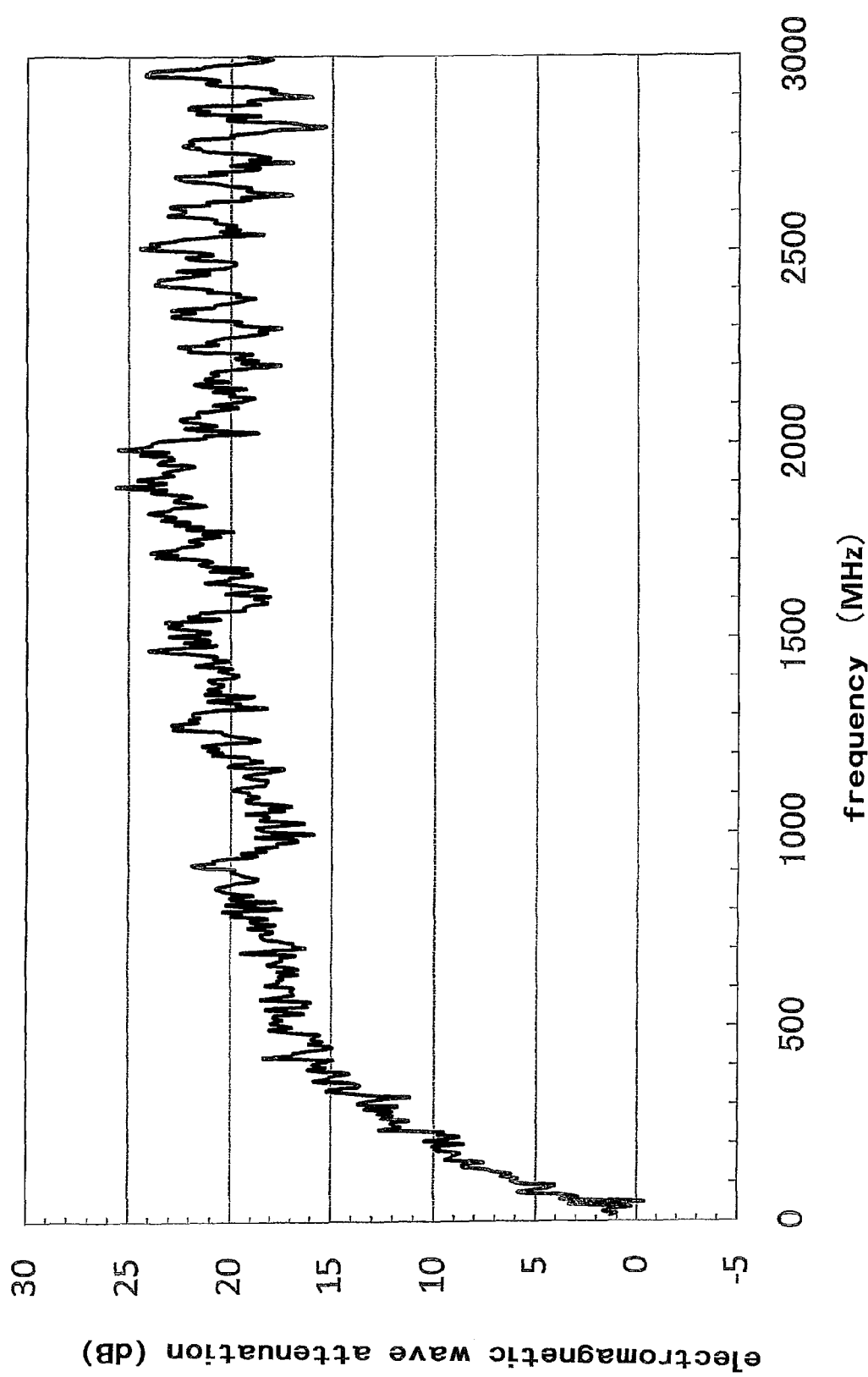
FIG. 7 is a graph showing a measurement result of electromagnetic wave attenuation (dB) of the film for the backside of a flip-chip type semiconductor according to Example 3.
Figure 8:
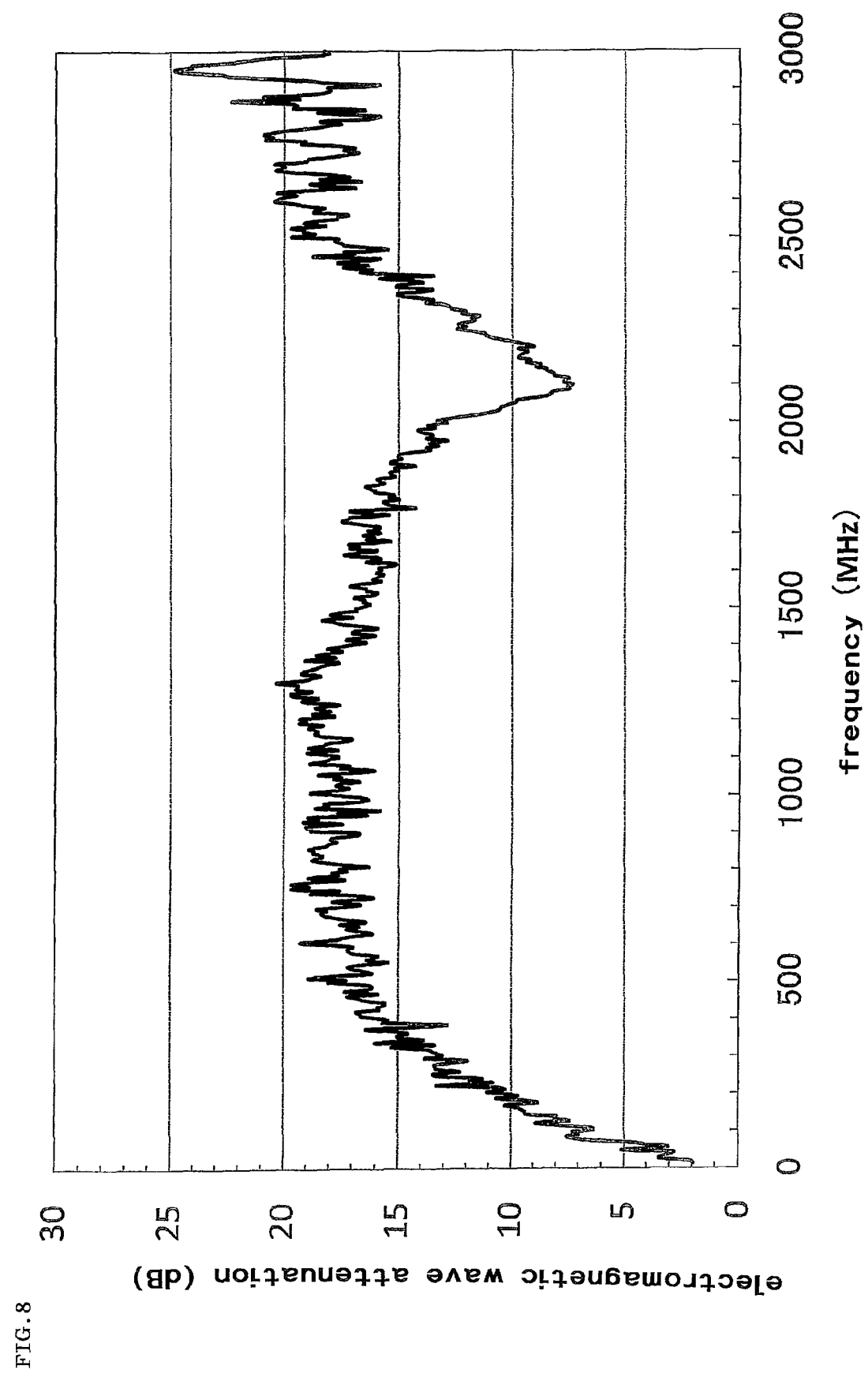
FIG. 8 is a graph showing a measurement result of electromagnetic wave attenuation (dB) of the film for the backside of a flip-chip type semiconductor according to Example 4.
Figure 9:
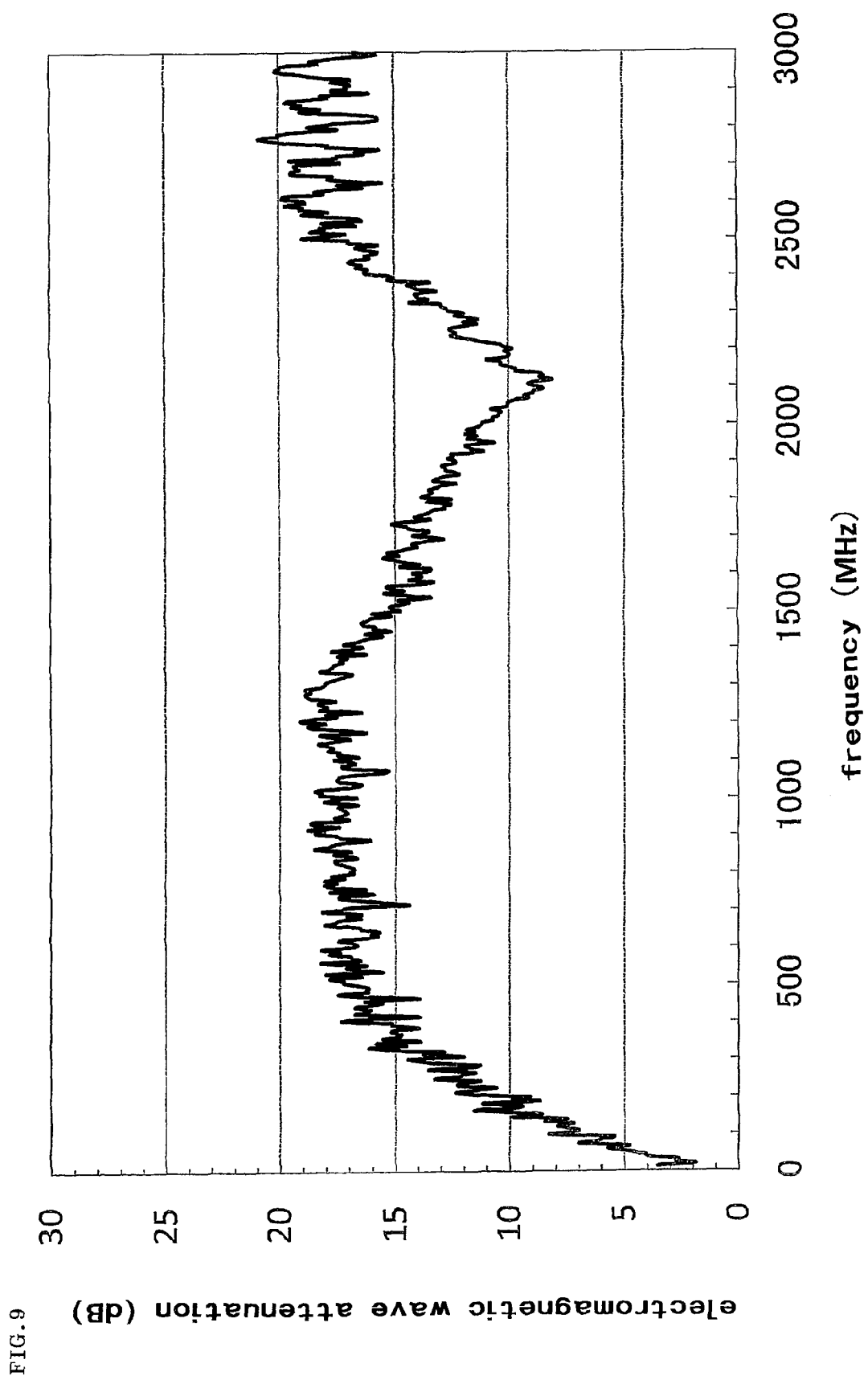
FIG. 9 is a graph showing a measurement result of electromagnetic wave attenuation (dB) of the film for the backside of a flip-chip type semiconductor according to Example 5.
Figure 10:
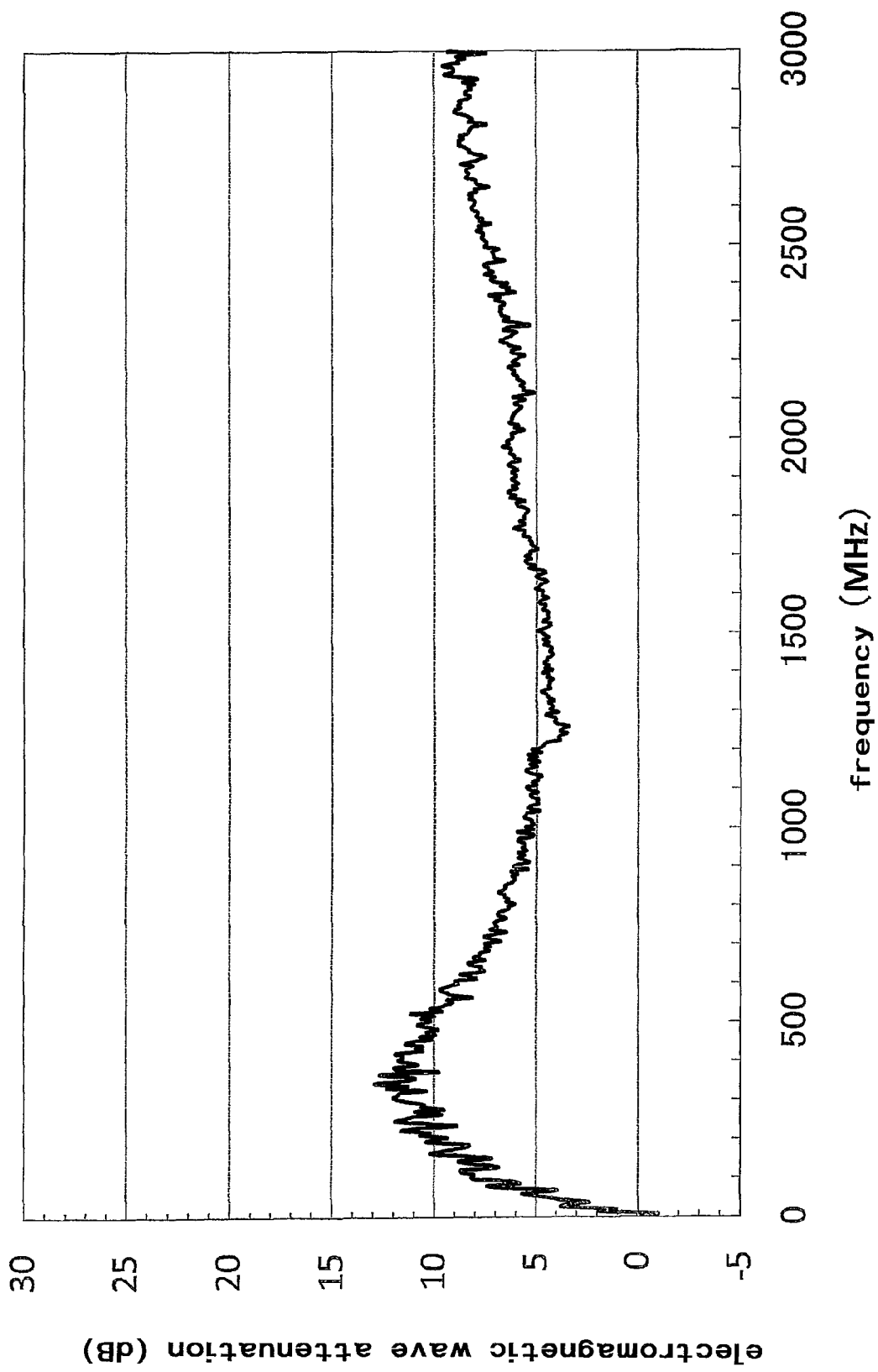
FIG. 10 is a graph showing a measurement result of electromagnetic wave attenuation (dB) of the film for the backside of a flip-chip type semiconductor according to Example 6.

In the following, the method of manufacturing a semiconductor device according to this embodiment is explained by referring to FIG. 4. FIG. 4 is a sectional schematic drawing showing a method of manufacturing a semiconductor device using the dicing tape-integrated film 1 for the backside of a semiconductor.

In the method of manufacturing a semiconductor device, a semiconductor device can be manufactured using the dicing tape-integrated film 1 for the backside of a semiconductor. Specifically, the method includes at least a step of pasting a semiconductor wafer onto the dicing tape-integrated film for the backside of a semiconductor, a step of dicing the semiconductor wafer, a step of picking up a semiconductor element that is obtained by dicing, and a step of flip-chip connecting the semiconductor element onto an adherend.

In case of the film 40 for the backside of a semiconductor, a semiconductor device can be manufactured by a method following a method of manufacturing a semiconductor device using the dicing tape-integrated film 1 for the backside of a semiconductor. For example, a semiconductor device can be manufactured by pasting the film 40 for the backside of a semiconductor and a dicing tape together and using the resultant as the dicing tape-integrated film for the backside of a semiconductor in which the film 40 is integrated with the dicing tape. In this case, the method of manufacturing a semiconductor device using the film 40 for the backside of a semiconductor is a manufacturing method including a step of pasting the film for the backside of a semiconductor and a dicing tape together so that the film for the backside of a semiconductor and the pressure-sensitive adhesive layer of the dicing tape come into contact with each other in addition to the steps of the method of manufacturing the dicing tape-integrated film for the backside of a semiconductor.

The film 40 for the backside of a semiconductor may be used by pasting to a semiconductor wafer without integrating with the dicing tape. In this case, a step of pasting a semiconductor wafer onto the dicing tape-integrated film for the backside of a semiconductor in the method of manufacturing the dicing tape-integrated film for the backside of a semiconductor is a step of pasting the film for the backside of a semiconductor to a semiconductor wafer and a step of pasting the dicing tape to the film for the backside of a semiconductor that is pasted to the semiconductor wafer so that the film for the backside of a semiconductor and the pressure-sensitive adhesive layer of the dicing tape come into contact with each other in the method of manufacturing a semiconductor device using the film 40 for the backside of a semiconductor.

The film 40 for the backside of a semiconductor can be used by pasting the semiconductor wafer to an individual semiconductor chip. In this case, the method of manufacturing a semiconductor device using the film 40 for the backside of a semiconductor may include at least a step of pasting a dicing tape to a semiconductor wafer, a step of dicing the semiconductor wafer, a step of picking up the semiconductor element that is obtained by dicing, a step of flip-chip connecting the semiconductor element to an adherend, and a step of pasting a film for the backside of a semiconductor to the semiconductor element.

[Mounting Step]

As shown in FIG. 4(a), the separator that is appropriately provided on the film 40 for the backside of a semiconductor of the dicing tape-integrated film 1 for the backside of a semiconductor is appropriately peeled off, a semiconductor wafer 4 is pasted to the film 40 for the backside of a semiconductor, and the laminate is fixed by adhering and holding (a mounting step). At this time, the film 40 for the backside of a semiconductor is uncured (including a condition of being partially cured). The dicing tape-integrated film 1 for the backside of a semiconductor is pasted to the backside of the semiconductor wafer 4. The backside of the semiconductor wafer 4 means the surface opposite to the circuit surface (also referred to as a non-circuit surface or a non-electrode forming surface). The pasting method is not especially limited, and a pasting method by pressure-bonding is preferable. The pressure-bonding is performed by pressing by a pressing means such as a press roll.

[Dicing Step]

As shown in FIG. 4(b), dicing of the semiconductor wafer 4 is performed. With this operation, the semiconductor wafer 4 is cut into individual pieces (cut into small pieces) having a prescribed size, and a semiconductor chip 5 is manufactured. The dicing is performed from the circuit surface side of the semiconductor wafer 4 by a normal method, for example. For example, a cutting method called full cut in which cutting is performed up to the dicing tape-integrated film 1 for the backside of a semiconductor can be adopted in this step. The dicing apparatus used in this step is not especially limited, and a conventionally known apparatus can be used. Because the semiconductor wafer 4 is adhered and fixed with excellent adhesion by the dicing tape-integrated film 1 for the backside of a semiconductor having the film for the backside of a semiconductor, chip cracks and chip fly can be suppressed and damages to the semiconductor wafer 4 can also be suppressed. When the electromagnetic wave shielding layer 31 that configures the film 40 for the backside of a semiconductor is a vapor deposited film that is formed by a vapor deposition method, the cutting scraps hardly generate in blade dicing and contamination of the semiconductor chip can be prevented. Further, damages to the blade can be suppressed.

When expanding the dicing tape-integrated film 1 for the backside of a semiconductor, a conventionally known expanding apparatus can be used. The expanding apparatus has a donut-shaped outer ring that can push down the dicing tape-integrated film 1 for the backside of a semiconductor through a dicing ring and an inner ring that has a smaller diameter than the outer ring and that supports the dicing tape-integrated film for the backside of a semiconductor. With this expanding step, generation of damages caused by the contact between adjacent semiconductor chips can be prevented in the pickup step described later.

[Pickup Step]

The semiconductor chip 5 is peeled from the dicing tape 2 together with the film 40 for the backside of a semiconductor by performing pickup of the semiconductor chip 5 as shown in FIG. 4(c) to collect the semiconductor chip 5 that is adhered and fixed to the dicing tape-integrated film 1 for the backside of a semiconductor. The pickup method is not especially limited, and various conventionally known methods can be adopted. An example of the method is a method of pushing up an individual semiconductor chip 5 from the side of the base 21 of the dicing tape-integrated film 1 for the backside of a semiconductor with a needle and picking up the pushed semiconductor chip 5 with a pickup apparatus. The backside of the semiconductor chip 5 that is picked up is protected by the film 40 for the backside of a semiconductor.

[Flip-chip Connecting Step]

As shown in FIG. 4(d), the semiconductor chip 5 that is picked up is fixed to an adherend such as a substrate by a flip-chip bonding method (flip-chip mounting method). Specifically, the semiconductor chip 5 is fixed to an adherend 6 by a normal method in a form that the circuit surface (also referred to as the surface, a circuit pattern forming surface, or an electrode forming surface) of the semiconductor chip 5 faces the adherend 6. The semiconductor chip 5 can be fixed to the adherend 6 while securing electrical conduction of the semiconductor chip 5 with the adherend 6 by contacting and pressing a bump 51 formed on the circuit surface side of the semiconductor chip 5 to a conductive material 61 such as solder for bonding that is adhered to a connection pad of the adherend 6 and melting the conductive material (a flip-chip bonding step). At this time, a space is formed between the semiconductor chip 5 and the adherend 6, and the distance of the space is generally about 30 to 300 μm. After flip-chip bonding (flip-chip connection) of the semiconductor chip 5 onto the adherend 6, it is important to wash the facing surface and the space between the semiconductor chip 5 to the adherend 6 and to seal the space by filling the space with a sealing material such as a sealing resin.

Various substrates such as a lead frame and a circuit board (a wiring circuit board, for example) can be used as the adherend 6. The material of the substrate is not especially limited, and examples thereof include a ceramic substrate and a plastic substrate. Examples of the plastic substrate include an epoxy substrate, a bismaleimide triazine substrate, and a polyimide substrate.

The material of the bump and the conductive material in the flip-chip bonding step are not especially limited, and examples thereof include solders (alloys) of a tin-lead metal material, a tin-silver metal material, a tin-silver-copper metal material, a tin-zinc metal material, and a tin-zinc-bismuth metal material, a gold metal material, and a copper metal material.

In the flip-chip bonding step, the bump of the circuit surface side of the semiconductor chip 5 and the conductive material on the surface of the adherend 6 are connected by melting the conductive material. The temperature when the conductive material is molten is normally about 260° C. (250 to 300° C., for example). The dicing tape-integrated film for the backside of a semiconductor of the present invention can have heat resistance so that it can resist a high temperature in the flip-chip bonding step by forming the film for the backside of a semiconductor with an epoxy resin, or the like.

In this step, the facing surface (an electrode forming surface) and the space between the semiconductor chip 5 and the adherend 6 are preferably washed. The washing liquid that is used in washing is not especially limited, and examples thereof include an organic washing liquid and a water washing liquid. The film for the backside of a semiconductor in the dicing tape-integrated film for the backside of a semiconductor of the present invention has solvent resistance to the washing liquid, and does not substantially have solubility in these washing liquids. Because of that, various washing liquids can be used as the washing liquid, and washing can be performed by a conventional method without requiring a special washing liquid.

Next, a sealing step is performed to seal the space between the flip-chip bonded semiconductor chip 5 and the adherend 6. The sealing step is performed using a sealing resin. The sealing condition is not especially limited. Thermal curing (reflow) of the sealing resin is performed normally by heating the sealing resin at 175° C. for 60 to 90 seconds. However, the present invention is not limited to this, and curing can be performed at 165 to 185° C. for a few minutes, for example. In the heat treatment in this step, thermal curing of not only the sealing resin but also of the adhesive layer 30 of the film 40 for the backside of a semiconductor is performed at the same time. With this operation, curing shrinkage of both the sealing resin and the adhesive layer 30 occurs as the thermal curing progresses. As a result, stress that is applied to the semiconductor chip 5 due to the curing shrinkage of the sealing resin can be canceled out or relieved by the curing shrinkage of the adhesive layer 30. With this step, the adhesive layer 30 can be completely or almost completely thermally cured, and the layer can be pasted to the backside of the semiconductor element with excellent adhesion. Because the adhesive layer 30 according to the present invention can be thermally cured together with the sealing material in the sealing step even when the layer is uncured before this step, there is no necessity to add a new step to thermally cure the adhesive layer 30.

The sealing resin is not especially limited as long as it is a resin having insulation properties, and can be appropriately selected from sealing materials such as a known sealing resin. However, an insulating resin having elasticity is preferable. Examples of the sealing resin include a resin composition containing an epoxy resin. Examples of the epoxy resin include epoxy resins described above. The sealing resin with a resin composition containing an epoxy resin may contain a thermosetting resin such as a phenol resin other than the epoxy resin, a thermoplastic resin, and the like as a resin component besides the epoxy resin. The phenol resin can also be used as a curing agent for the epoxy resin, and examples of the phenol resin include the above-described phenol resins.

Because the film for the backside of a semiconductor is pasted to the backside of a semiconductor chip in the semiconductor device (flip-chip mounted semiconductor device) that is manufactured using the dicing tape-integrated film 1 for the backside of a semiconductor and the film 40 for the backside of a semiconductor, various markings can be performed with excellent visibility. Even when marking is performed by a laser marking method, marking can be performed with an excellent contrast ratio, and various information such as character information and graphic information marked by laser marking can be visually recognized well. A known laser marking apparatus can be used when performing laser marking. Various lasers such as a gas laser, a solid laser, and a liquid laser can be used. Specifically, the gas laser is not especially limited, and a known gas laser can be used. However, a carbon dioxide gas laser ($CO_2$ laser) and an excimer laser such as an ArF laser, a KrF laser, an XeCl laser, or an XeF laser are suitable. The solid laser is not especially limited, and a known solid laser can be used. However, a YAG laser such as an Nd:YAG laser and a $YVO_4$ laser are suitable.

After the laser marking is performed to the film 40 for the backside of a semiconductor, a heat treatment (a reflow step that is performed after laser marking) may be performed as necessary. The condition of the heat treatment is not especially limited, and the heat treatment can be performed according to the standards by JEDEC Solid State Technology Association. For example, the heat treatment can be performed at a temperature (upper limit) of 210 to 270° C. and a period of 5 to 50 seconds. With this step, a semiconductor package can be mounted on a substrate such as a mother board.

Because the semiconductor device that is manufactured using the dicing tape-integrated film for the backside of a semiconductor and the film for the backside of a semiconductor of the present invention is a semiconductor device that is mounted by a flip-chip mounting method, the semiconductor device has a shape thinner and smaller than a semiconductor device that is mounted by a die bonding mounting method. Because of this, the semiconductor device can be suitably used as various electronic apparatuses and electronic parts or materials and members thereof. Specific examples of the electronic apparatus in which the flip-chip mounted semiconductor device of the present invention can be used include a portable phone, PHS, a small computer such as PDA (personal digital assistant), a notebook personal computer, Netbook (trademark), or a wearable computer, a small electronic apparatus in which a portable phone and a computer are integrated, Digital Camera (trademark), a digital video camera, a small television, a small game machine, a small digital audio player, an electronic organizer, an electronic dictionary, an electronic apparatus terminal for an electronic book, and a mobile electronic apparatus (portable electronic apparatus) such as a small digital type clock or watch. Examples of the electronic apparatus also include an electronic apparatus other than a mobile type apparatus (i.e., a stationary apparatus) such as a desktop personal computer, a flat-panel television, an electronic apparatus for recording and playing such as a hard disc recorder or a DVD player, a projector, or a micromachine. Examples of the electronic parts or materials and members of the electronic apparatus and electronic parts include a component of CPU and components of various recording apparatuses such as a memory and a hard disk.

The case in which an electromagnetic wave shielding layer 31 is a single layer was explained in the above-described embodiment. However, the electromagnetic wave shielding layer is not limited to a single layer and it may be two or more layers in the present invention. When the electromagnetic wave shielding layer has two or more layers, the layer configuration is not especially limited. For example, a plurality of electromagnetic wave shielding layers may be laminated without other layers interposed therebetween, or a plurality of electromagnetic wave shielding layers may be laminated with other layers (adhesive layers for example) interposed therebetween. When the electromagnetic wave shielding layer has two or more layers, the electromagnetic wave can be attenuated by one electromagnetic wave shielding layer first and further attenuated by other electromagnetic wave shielding layers.

EXAMPLES

Below, preferred examples of the present invention are explained in detail. However, materials, addition amounts, and the like described in these examples are not intended to limit the scope of the present invention, and are only examples for explanation as long as there is no description of limitation in particular. Further, "part" means "parts by weight."

Example 1

<Production of Adhesive Layer A>
Adhesive composition solutions having a concentration of 23.6% by weight were obtained by dissolving the following (a) to (f) in methylethylketone.
(a) 100 parts of an acrylic ester polymer having ethyl acrylate-methyl methacrylate as a main component (Paracron W-197CM manufactured by Negami Chemical Industries Co., Ltd.)
(b) 242 parts of an epoxy resin 1 (Epicoat 1004 manufactured by Japan Epoxy Resin Co., Ltd.)
(c) 220 parts of an epoxy resin 2 (Epicoat 827 manufactured by Japan Epoxy Resin Co., Ltd.)
(d) 489 parts of a phenol resin (Milex XLC-4L manufactured by Mitsui Chemicals, Inc.)
(e) 660 parts of spherical silica (SO-25R manufactured by Admatechs Co., Ltd.)
(f) 3 parts of a thermosetting catalyst (C11-Z manufactured by Shikoku Chemicals Corporation)
An adhesive layer A having a thickness of 60 μm was produced by applying this adhesive composition solution onto a release-treated film (a release liner) made of polyethylene terephthalate and having a thickness of 50 μm subjected to a silicone releasing treatment and drying the solution at 130° C. for 2 minutes.

<Production of Adhesive Layer B>
Adhesive composition solutions having a concentration of 23.6% by weight were obtained by dissolving the following (a) to (d) in methylethylketone.
(a) 100 parts of an acrylic ester polymer (SG-80H manufactured by Nagase ChemteX Corporation)
(b) 10 parts of an epoxy resin (HP-7200H manufactured by DIC Corporation)
(c) 10 parts of a phenol resin (Milex XLC-4L manufactured by Mitsui Chemicals, Inc.)
(d) 63 parts of spherical silica (SO-25R manufactured by Admatechs Co., Ltd.)
An adhesive layer B having a thickness of 10 μm was produced by applying this adhesive composition solution onto a release-treated film (a release liner) made of polyethylene terephthalate and having a thickness of 50 μm subjected to a silicone releasing treatment and drying the solution at 130° C. for 2 minutes.

<Production of Film for the Backside of Semiconductor>
A film for the backside of semiconductor having a thickness of 90 μm was produced by pasting an aluminum foil manufactured by Toyo Aluminum. K.K. having a thickness of 20 μm between the adhesive layer A and the adhesive layer B under conditions of a temperature of 80° C., a pasting pressure of 0.3 MPa, and a pasting speed of 10 mm/sec. The aluminum foil has a function as an electromagnetic wave shielding layer.

Example 2

<Production of Film for the Backside of Semiconductor>
A film for the backside of semiconductor having a thickness of 108 μm was produced by pasting a SUS304 (stainless steel) foil having a thickness of 38 μm between the adhesive layer A and the adhesive layer B under conditions of a temperature of 80° C., a pasting pressure of 0.3 MPa, and a pasting speed of 10 mm/sec. The SUS304 foil has a function as an electromagnetic wave shielding layer.

Example 3

<Production of Film for the Backside of Semiconductor>
An aluminum layer having a thickness of 500 nm was formed on the adhesive layer A by a sputtering method using a sputtering machine (SH-550 manufactured by ULVAC, Inc.). The sputtering conditions were as follows.

| (Sputtering conditions) | |
|---|---|
| Target: | Aluminum |
| Discharge power: | DC 600 W (Output density 3.4 W/cm$^2$) |
| System pressure: | 0.56 Pa |
| Ar flow rate: | 40 sccm |
| Substrate temperature: | not heated |
| Film forming rate: | 20 nm/min |

Then, a film for the backside of semiconductor having a thickness of 70.5 μm was produced by pasting the adhesive layer B onto an aluminum layer under conditions of a temperature of 80° C., a pasting pressure of 0.3 MPa, and a pasting speed of 10 mm/sec. The aluminum layer has a function as an electromagnetic wave shielding layer.

Example 4

<Production of Film for the Backside of Semiconductor>
A film for the backside of semiconductor having a thickness of 90 μm was produced by pasting a nickel foil having a thickness of 20 μm between the adhesive layer A and the adhesive layer B under conditions of a temperature of 80° C., a pasting pressure of 0.3 MPa, and a pasting speed of 10 mm/sec. The nickel foil has a function as an electromagnetic wave shielding layer.

Example 5

<Production of Film for the Backside of Semiconductor>
A film for the backside of semiconductor having a thickness of 82 μm was produced by pasting a copper foil having a thickness of 12 μm between the adhesive layer A and the adhesive layer B under conditions of a temperature of 80° C., a pasting pressure of 0.3 MPa, and a pasting speed of 10 mm/sec. The copper foil has a function as an electromagnetic wave shielding layer.

Example 6

<Production of Film for the Backside of Semiconductor>
A film was prepared having a PET (polyethylene terephthalate) film having a thickness of 50 μm on both sides and on which a finemet layer having a thickness of 18 μm was formed (FP-FT-5M manufactured by Hitachi Metals, Ltd., referred to as "a finemet film" in the following). The finemet layer is an amorphous thin zone that was formed by solidifying a high temperature melt liquid of a composition in which Si (silicon), B (boron), a small amount of Cu (copper), and Nb (niobium) were added into Fe as the main component by rapidly cooling at about 1,000,000° C./sec.

Then, a film for the backside of semiconductor having a thickness of 188 μm was produced by pasting the finemet film between the adhesive layer A and the adhesive layer B under conditions of a temperature of 80° C., a pasting pressure of 0.3 MPa, and a pasting speed of 10 mm/sec. At this time, the film was pasted so that the adhesive layer A and the PET film would face each other and the adhesive layer B and the finemet layer would face each other. The finemet layer has a function as an electromagnetic wave shielding layer.

Comparative Example 1

The film for the backside of semiconductor according to this comparative example was produced by pasting the adhesive layer A and the adhesive layer B together in the same manner as in Example 1 except that the aluminum foil was not used.

Comparative Example 2

<Production of Film for the Backside of Semiconductor>

A film was prepared in which a ferrite layer having a thickness of 3 μm was formed on a PET film having a thickness of 38 μm. The ferrite layer according to Comparative Example 2 is a layer made of NiZn ferrite produced by a ferrite plating method.

Then, a film for the backside of semiconductor having a thickness of 111 μm was produced by pasting the ferrite film between the adhesive layer A and the adhesive layer B under conditions of a temperature of 80° C., a pasting pressure of 0.3 MPa, and a pasting speed of 10 mm/sec. At this time, the film was pasted so that the adhesive layer A and the PET film would face each other and the adhesive layer B and the ferrite layer would face each other.

<Measurement of Electromagnetic Wave Attenuation (dB)>

Figure 11:
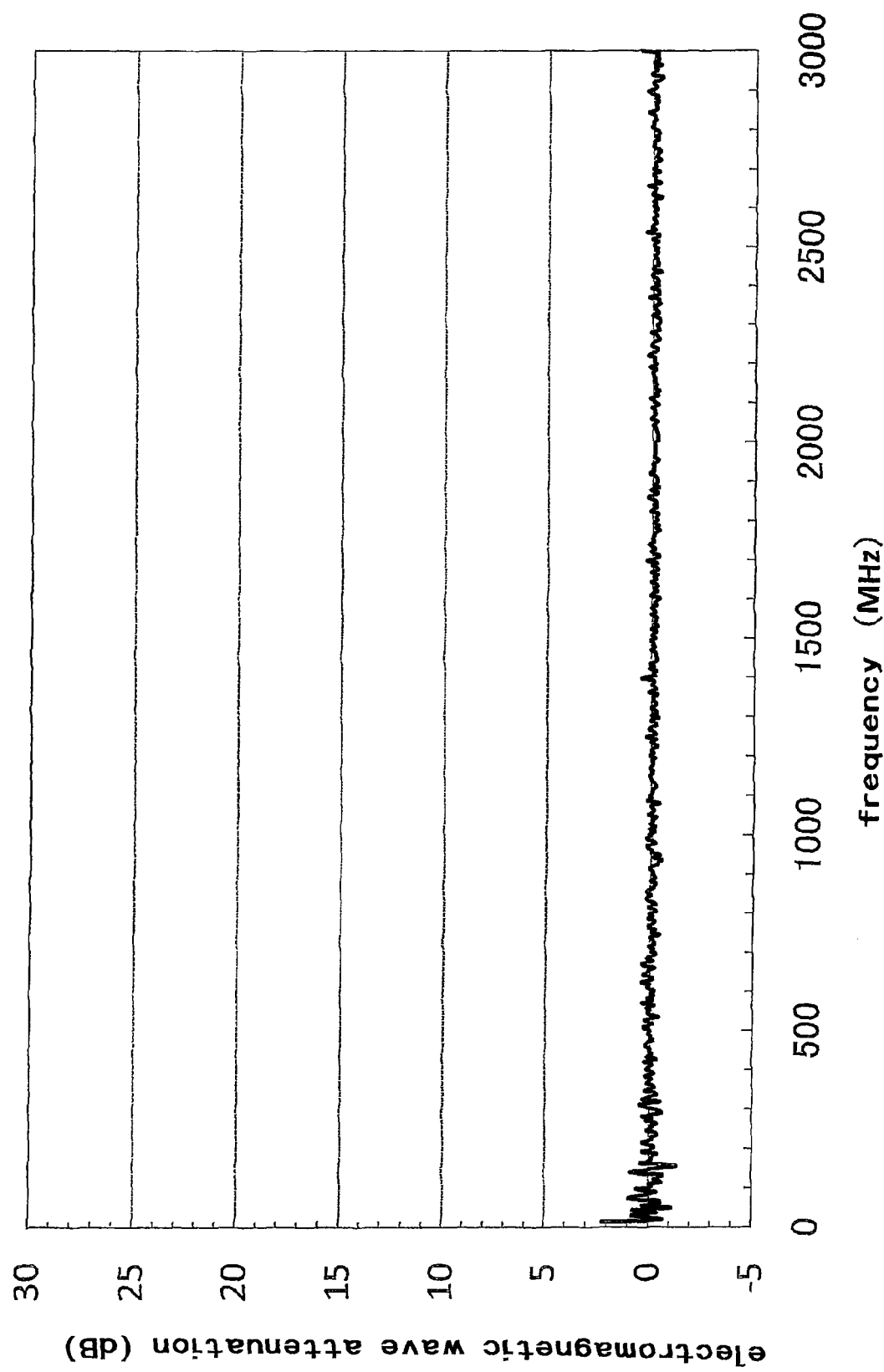
FIG. 11 is a graph showing a measurement result of electromagnetic wave attenuation (dB) of the film for the backside of a flip-chip type semiconductor according to Comparative Example 1.
Figure 12:
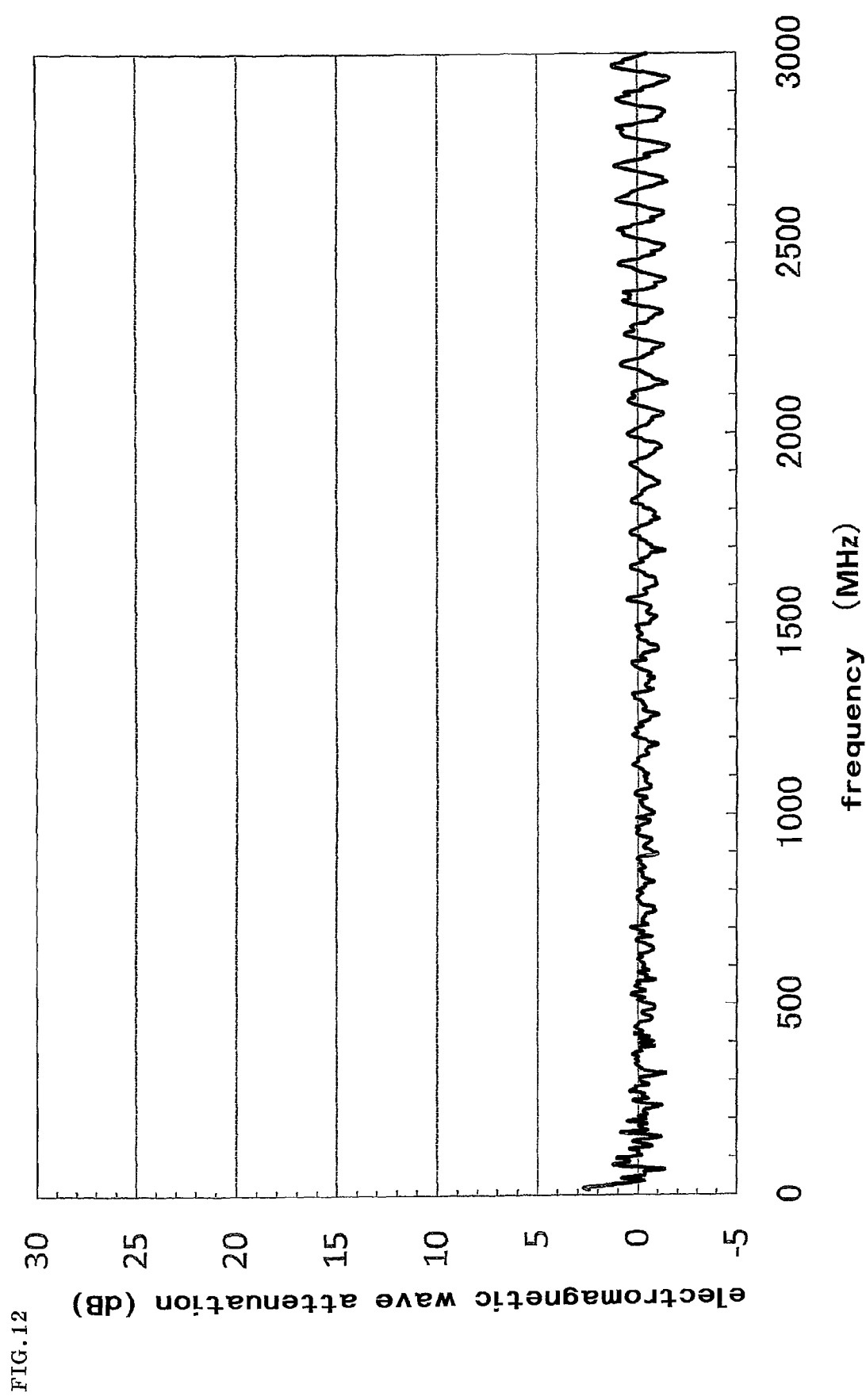
FIG. 12 is a graph showing a measurement result of electromagnetic wave attenuation (dB) of the film for the backside of a flip-chip type semiconductor according to Comparative Example 2.

The electromagnetic wave attenuation (dB) of the film for the backside of semiconductors according to the examples and comparative examples was measured by a magnetic field probe method. Specifically, a digital signal of a frequency of 13 MHz to 3 GHz was input to a MSL line having a characteristic impedance of 50Ω using a spectrum. analyzer (R3172 manufacture by Advantest Corporation), and then the intensity (dB) of the magnetic field that was generated on 1 mm of the line was measured using a magnetic field probe (CP-2S manufactured by NEC Engineering, Ltd.). Then, the film for the backside of semiconductors according to the examples and comparative examples were placed on the MSL line, and the intensity (dB) of the magnetic field was measured. The electromagnetic wave attenuation (dB) in a range of 13 MHz to 3 GHz was obtained by calculating the difference between the measurement value in a state where nothing was placed on the MSL line and the measurement value in a state where the film for the backside of semiconductor was placed on the MSL line. The measurement result is shown in Table 1. Graphs that were obtained from the measurement result shown in Table 1 are shown in FIGS. 5 to 12. FIGS. 5 to 10 are each a graph showing the measurement result of Examples 1 to 6 respectively, and FIGS. 11 and 12 are each a graph showing the measurement result of Comparative Examples 1 and 2 respectively.

TABLE 1

| MHz | Example 1 | Example 2 | Example 3 | Example 4 | Example 5 | Example 6 | Comparative Example 1 | Unit: dB Comparative Example 2 |
|---|---|---|---|---|---|---|---|---|
| 13 | 3.23 | 5.84 | 1.31 | 1.95 | 3.55 | 1.89 | 2.20 | 2.43 |
| 19 | 2.81 | 5.28 | 1.05 | 2.08 | 1.90 | 1.09 | −0.59 | 2.67 |
| 31 | 4.30 | 2.34 | 1.27 | 3.28 | 2.60 | 3.48 | 0.80 | 0.42 |
| 43 | 3.76 | 5.15 | 3.35 | 2.83 | 4.06 | 3.73 | 0.76 | 0.78 |
| 55 | 3.35 | 2.93 | 3.66 | 3.10 | 5.15 | 5.13 | 0.30 | −0.38 |
| 103 | 6.70 | 8.73 | 6.18 | 6.34 | 7.41 | 8.18 | −0.10 | −0.16 |
| 151 | 9.17 | 9.21 | 7.59 | 9.38 | 8.59 | 7.21 | −0.63 | −1.15 |
| 205 | 10.65 | 10.20 | 10.41 | 11.04 | 11.49 | 9.35 | −0.20 | −0.03 |
| 301 | 14.52 | 12.64 | 13.63 | 13.05 | 14.40 | 11.66 | −0.12 | −0.12 |
| 403 | 16.27 | 15.79 | 15.90 | 15.84 | 17.30 | 11.70 | 0.14 | −0.78 |
| 505 | 18.63 | 16.97 | 17.53 | 17.27 | 17.21 | 10.15 | 0.10 | −0.29 |
| 601 | 19.24 | 17.49 | 16.89 | 18.03 | 16.90 | 8.81 | −0.20 | −0.31 |
| 703 | 18.09 | 18.49 | 16.32 | 17.11 | 17.36 | 7.49 | −0.08 | 0.32 |
| 805 | 18.96 | 18.78 | 17.48 | 17.52 | 16.95 | 6.05 | −0.23 | −0.20 |
| 901 | 19.27 | 18.26 | 19.98 | 16.72 | 17.55 | 6.09 | −0.11 | −0.78 |
| 1003 | 18.72 | 18.45 | 17.84 | 17.76 | 16.68 | 5.55 | 0.02 | −0.78 |
| 1105 | 19.78 | 17.84 | 19.11 | 17.60 | 17.65 | 5.49 | −0.04 | −0.51 |
| 1201 | 18.48 | 20.44 | 20.87 | 19.01 | 18.04 | 5.18 | 0.04 | −0.01 |
| 1303 | 20.97 | 19.64 | 21.86 | 20.33 | 18.08 | 4.27 | −0.03 | 0.13 |
| 1405 | 15.23 | 17.00 | 19.61 | 17.01 | 16.41 | 4.19 | −0.13 | −0.40 |
| 1501 | 13.06 | 16.29 | 21.36 | 16.86 | 14.80 | 4.64 | −0.14 | −0.59 |
| 1602 | 12.78 | 13.03 | 18.85 | 15.74 | 14.20 | 4.69 | −0.36 | −0.95 |
| 1704 | 16.20 | 15.43 | 21.47 | 15.82 | 14.21 | 5.27 | −0.18 | −0.72 |
| 1800 | 18.59 | 16.17 | 22.02 | 15.43 | 12.50 | 5.60 | −0.19 | −0.61 |
| 1902 | 24.13 | 20.35 | 23.21 | 14.87 | 12.30 | 6.02 | −0.20 | −0.11 |
| 2004 | 20.58 | 19.32 | 23.84 | 13.33 | 11.07 | 6.16 | −0.23 | 0.25 |
| 2100 | 18.24 | 18.25 | 20.84 | 7.30 | 8.70 | 5.53 | −0.12 | 0.21 |
| 2202 | 19.10 | 19.00 | 17.55 | 9.03 | 9.83 | 5.98 | −0.09 | −0.35 |
| 2298 | 17.79 | 18.75 | 17.51 | 12.02 | 11.93 | 5.93 | −0.20 | −0.60 |
| 2400 | 20.97 | 21.48 | 20.95 | 15.72 | 15.28 | 6.41 | −0.22 | −1.26 |
| 2502 | 23.70 | 24.37 | 23.27 | 19.63 | 18.93 | 7.41 | −0.03 | −0.88 |
| 2598 | 24.31 | 23.57 | 22.34 | 20.38 | 18.87 | 8.12 | −0.19 | −0.38 |
| 2700 | 21.21 | 21.82 | 20.27 | 20.36 | 19.27 | 8.33 | 0.00 | 0.78 |
| 2802 | 19.26 | 20.30 | 20.01 | 18.09 | 18.68 | 8.19 | −0.05 | 0.71 |

TABLE 1-continued

Unit: dB

| MHz | Example 1 | Example 2 | Example 3 | Example 4 | Example 5 | Example 6 | Comparative Example 1 | Comparative Example 2 |
|---|---|---|---|---|---|---|---|---|
| 2904 | 19.13 | 17.08 | 17.30 | 18.08 | 17.06 | 8.16 | −0.02 | −0.27 |
| 3000 | 15.73 | 20.89 | 19.15 | 18.25 | 16.73 | 9.31 | 0.58 | −0.51 |

What is claimed is:

1. A dicing tape-integrated film for the backside of a semiconductor in which a film for the backside of a flip-chip type semiconductor to be formed on the backside of a semiconductor element that is flip-chip connected to an adherend is laminated on a dicing tape, wherein
the film for the backside of a flip-chip type semiconductor has an adhesive layer and an electromagnetic wave shielding layer,
the dicing film has a structure in which a pressure-sensitive adhesive layer is laminated on a base, and
the film for the backside of a flip-chip type semiconductor is laminated on the pressure-sensitive adhesive layer of the dicing tape.

2. A method of manufacturing the film for the dicing tape-integrated film according to claim 1, comprising the steps of:
forming an adhesive layer and
forming an electromagnetic wave shielding layer on the adhesive layer.

3. A semiconductor device comprising the dicing tape-integrated film according to claim 1.

4. The dicing tape-integrated film of claim 1, wherein the adhesive layer comprises a thermosetting resin.

5. The dicing tape-integrated film of claim 1, wherein the adhesive layer is colored.

6. The dicing tape-integrated film of claim 1, wherein the film for the backside of a flip-chip type semiconductor has a transmittance of visible light of 20% or less.

7. The dicing tape-integrated film of claim 1, wherein the pressure-sensitive adhesive layer comprises a radiation curing type pressure-sensitive adhesive or a thermally expandable pressure-sensitive adhesive.

* * * * *

UNITED STATES PATENT AND TRADEMARK OFFICE
CERTIFICATE OF CORRECTION

PATENT NO. : 8,841,757 B2  
APPLICATION NO. : 13/298614  
DATED : September 23, 2014  
INVENTOR(S) : Daisuke Uenda et al.

Page 1 of 1

It is certified that error appears in the above-identified patent and that said Letters Patent is hereby corrected as shown below:

In the Specification,

In column 1 at line 11 (approx.), Change "the" to --The--.

In column 10 at lines 34-35, Change "diisiocyanate." to --diisocyanate.--.

In column 10 at line 48, Change "polyglyserol" to --polyglycerol--.

In column 11 at line 50, Change "l'Eclairage" to --L'Eclairage--.

In column 11 at line 50, Change "andmeans" to --and means--.

In column 18 at line 14, Change "unstreched," to --unstretched,--.

In column 19 at line 58, Change "dimethlaminoethyl" to --dimethylaminoethyl--.

In column 21 at line 22, Change "pentaerithritol" to --pentaerythritol--.

In column 21 at line 26, Change "-5-" to -- -S- --.

In column 23 at line 30, Change "calender" to --calendar--.

In column 32 at line 13 (approx.), Change "spectrum." to --spectrum--.

Signed and Sealed this  
Second Day of June, 2015

Michelle K. Lee  
*Director of the United States Patent and Trademark Office*